United States Patent
Kuo et al.

(10) Patent No.: US 12,476,178 B2
(45) Date of Patent: Nov. 18, 2025

(54) REDUCTION OF CRACKS IN REDISTRIBUTION STRUCTURE

(71) Applicant: Taiwan Semiconductor Manufacturing Company, Ltd., Hsinchu (TW)

(72) Inventors: Ting-Ting Kuo, Hsinchu (TW); Li-Hsien Huang, Hsinchu County (TW); Tien-Chung Yang, Hsinchu (TW); Yao-Chun Chuang, Hsinchu (TW); Yinlung Lu, Hsinchu (TW); Jun He, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 626 days.

(21) Appl. No.: 17/889,122

(22) Filed: Aug. 16, 2022

(65) Prior Publication Data
US 2024/0063099 A1    Feb. 22, 2024

(51) Int. Cl.
*H01L 21/48*    (2006.01)
*H01L 21/56*    (2006.01)
*H01L 23/498*    (2006.01)

(52) U.S. Cl.
CPC .... *H01L 23/49822* (2013.01); *H01L 21/4857* (2013.01); *H01L 21/56* (2013.01); *H01L 23/49894* (2013.01)

(58) Field of Classification Search
CPC .......... H01L 23/49822; H01L 21/4857; H01L 21/56; H01L 23/49894; H01L 2221/68359; H01L 2221/68372; H01L 21/568; H01L 21/6835; H01L 21/6836; H01L 23/562; H01L 23/3128; H01L 2221/68345; H01L 23/49816
(Continued)

(56) References Cited

U.S. PATENT DOCUMENTS

| 8,017,515 B2 | 9/2011 | Marimuthu |
| 8,519,515 B2 * | 8/2013 | Kuo ...................... H01L 23/481 257/E21.597 |

(Continued)

FOREIGN PATENT DOCUMENTS

CN    106098668 A    11/2016

*Primary Examiner* — Vu A Vu
(74) *Attorney, Agent, or Firm* — HAYNES AND BOONE, LLP

(57) ABSTRACT

The present disclosure provides methods and structures to prevent cracks in redistribution layers. A redistribution structure according to the present disclosure includes a first polymer layer disposed over a silicon substrate, a first contact via disposed in the first polymer layer, a second polymer layer disposed over the first contact via, a first redistribution layer including a first conductive pad disposed on the second polymer layer and a second contact via extending through the second polymer layer to physical contact the first contact via, a third polymer layer disposed over the first redistribution layer, a second redistribution layer including a second conductive pad disposed on the third polymer layer and a plurality of third contact vias extending through the third polymer layer to physically contact the first conductive pad. The first conductive pad has at least one opening and the second conductive pad has at least one opening.

20 Claims, 25 Drawing Sheets

(58) Field of Classification Search
 USPC .......................................................... 257/668
 See application file for complete search history.

(56) References Cited

U.S. PATENT DOCUMENTS

| | | | | |
|---|---|---|---|---|
| 9,659,878 | B2* | 5/2017 | Chen | .................... H01L 23/5389 |
| 11,158,608 | B2* | 10/2021 | Shen | .................... H01L 23/5389 |
| 11,456,242 | B2* | 9/2022 | Huang | ..................... H01L 24/02 |
| 2019/0214339 | A1 | 7/2019 | Aoki | |
| 2022/0028776 | A1 | 1/2022 | Huang | |
| 2023/0058497 | A1* | 2/2023 | Suk | ................... H01L 23/49822 |

\* cited by examiner

REDUCTION OF CRACKS IN REDISTRIBUTION STRUCTURE

BACKGROUND

A redistribution layer (RDL) is an extra metal layer that redirects signals from pads of an integrated circuit (IC) die to other locations for better access. As functional densities of IC dies continue to increase, an RDL structure that includes multiple RDLs is needed. An RDL structure includes multiple layers of metal layers and contact vias disposed in polymer layers. Because polymer layers have vastly different coefficients of thermal expansion (CTE) from those of semiconductor materials and metals, thermal cycles during fabrication processes and heat generated during high current usage may cause expansion of the polymer layers relative to surrounding features. In some instances, such expansion may cause damages to the metal layers, resulting in increased resistance or even open circuit. Therefore, while existing RDL structures are adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
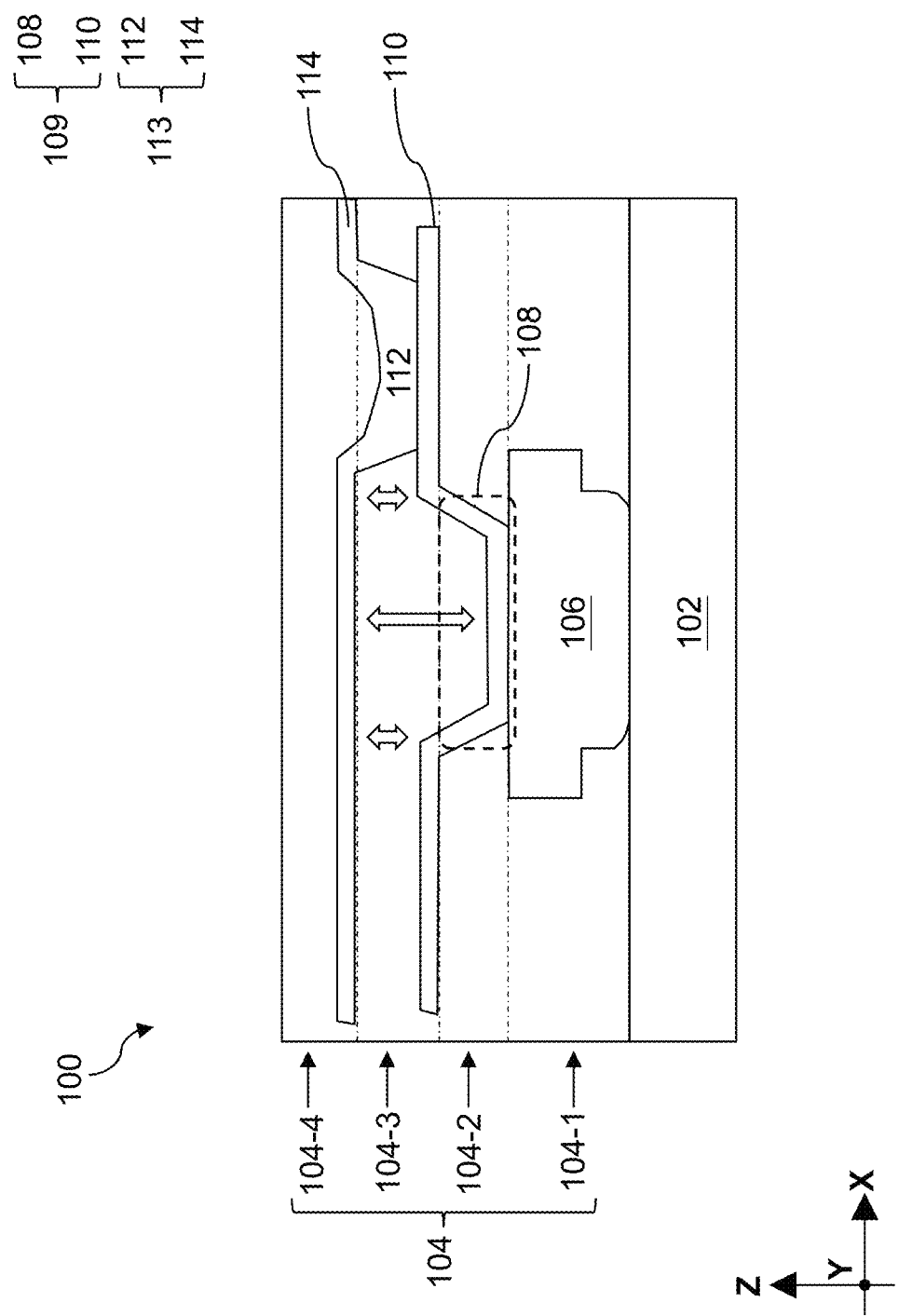
FIG. 1 is a fragmentary cross-sectional view of a first connecting pattern in an RDL structure that is less susceptible to cracks, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

A redistribution layer (RDL) is an extra metal layer that redirects signals from pads of an integrated circuit (IC) die to other locations for better access. As functional densities of IC dies continue to increase, an RDL structure that includes multiple RDLs is needed. An RDL structure includes multiple layers of metal layers and contact vias disposed in polymer layers. Because polymer layers have vastly different coefficients of thermal expansion (CTE) from those of semiconductor materials and metals, thermal cycles during fabrication processes and heat generated during high current usage may cause expansion of the polymer layers relative to surrounding features. In some instances where a portion of the polymer layers is confined by surrounding RDL metal features, stress from such thermal expansion may cause the RDL metal features to crack. Such crack may reduce current conduction cross-sections, resulting in increased resistance. When such crack is allowed to propagate around a contact via, it may even cause open circuit.

Depending on the design, an RDL structure may include different types of connecting patterns. Some of the connecting patterns are less susceptible to cracks caused by expansion of polymer layers and some are more susceptible to such crack risk. As will be made clear in the examples below, the susceptibility to crack depends on at least two factors. One of them is whether any portion of the polymer layers separating metal features is land-locked or confined by surrounding metal features. Another of them is whether the thermal expansion is confined by a structure having a relatively small CTE. Both of them have to do with how stress caused by CTE mismatch may be dissipated or whether the such stress is directed to metal features that are susceptible to cracks.

Figure 2:
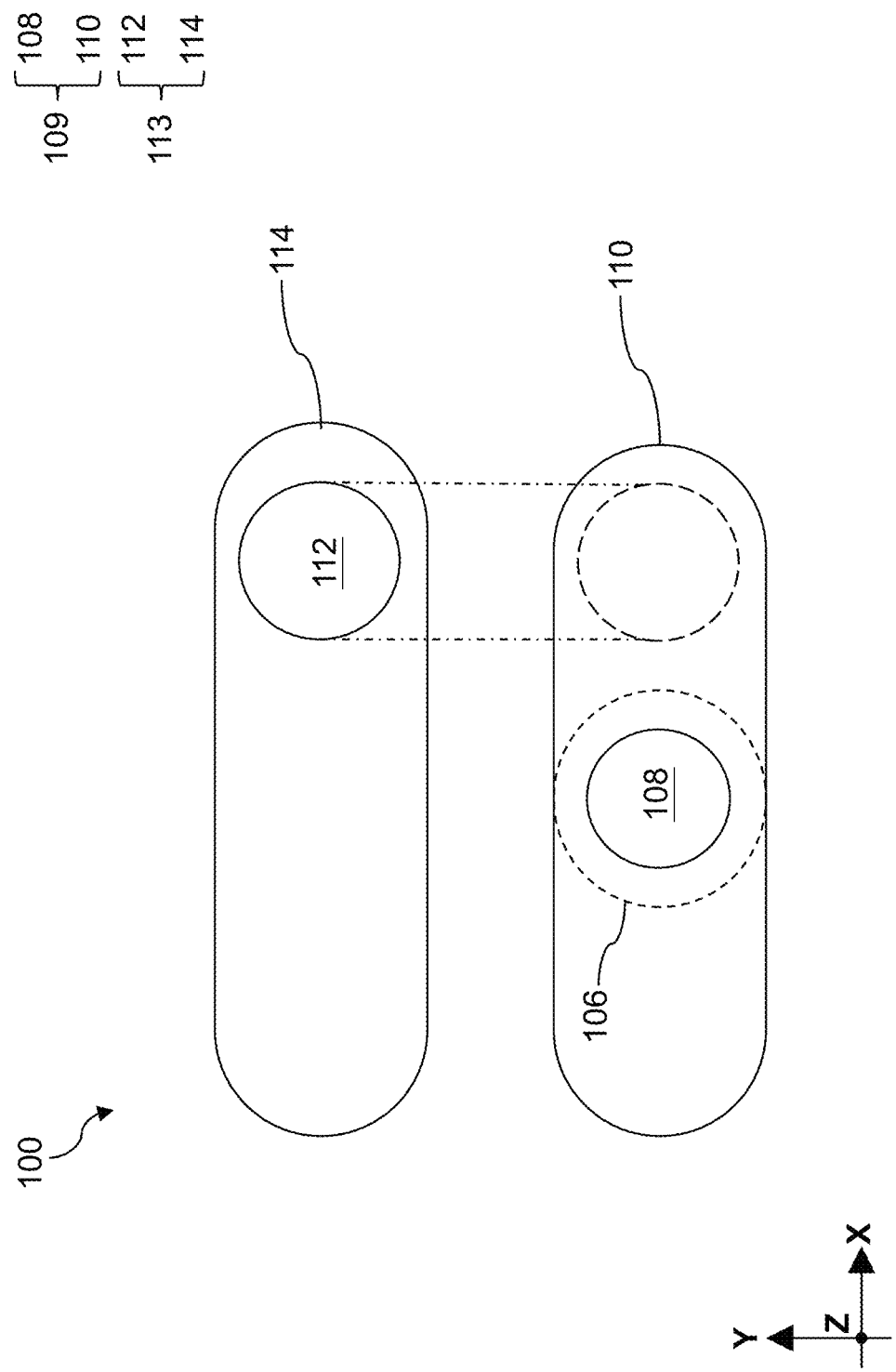
FIG. 2 illustrates fragmentary top views of redistribution layers in the first connecting pattern in the RDL structure shown in FIG. 1, according to various aspects of the present disclosure.

FIGS. 1 and 2 provide fragmentary cross-sectional and top views of a first connecting pattern 100 that is less susceptible to cracks. Reference is first made to FIG. 1. The first connecting pattern 100 in an RDL structure includes a substrate 102, a plurality of polymer layers 104 over the substrate 102, a first contact via 106 disposed over the substrate 102, a first RDL layer (RDL1) 109 over the first contact via 106, and a second RDL layer (RDL2) 113 over the first RDL layer 109. The first RDL layer 109 includes a first conductive pad 110 and a second contact via 108. The second RDL layer 113 includes a second conductive pad 114 and a third contact via 112. In the depicted embodiments, the plurality of polymer layer 104 includes a first polymer layer 104-1, a second polymer layer 104-2 over the first polymer layer 104-1, a third polymer layer 104-3 over the second polymer layer 104-2, and a fourth polymer layer 104-4 over the third polymer layer 104-3. As illustrated in FIG. 1, the second contact via 108 extends through the second polymer layer 104-2 to physically contact the first contact via 106 and the third contact via 112 extends through the third polymer layer 104-3 to physically contact the first conductive pad 110.

FIG. 2 illustrates top views of the first RDL layer 109 and the second RDL layer 113. In the depicted embodiments, both the first conductive pad 110 and the second conductive pad 114 have a racetrack shape. Along the vertical direction (Z direction), the second contact via 108 overlaps the first contact via 106. To ensure a proper process window, a vertical projection area of the second contact via 108 is smaller than and falls completely in a vertical projection of the first contact via 106. Along the vertical direction, the third contact via 112 overlaps the first conductive pad 110. In other words, a vertical projection of the third contact via 112 falls completely in the vertical projection of the first conductive pad 110.

The substrate 102 includes silicon. Alternatively or additionally, the substrate 102 may include germanium, silicon carbide, gallium arsenide, gallium phosphide, indium phosphide, indium arsenide, indium antimonide, silicon germanium, or combinations thereof. In some implementations, the substrate 102 may be a semiconductor-on-insulator substrate, such as a silicon-on-insulator (SOI) substrate, a silicon germanium-on-insulator (SGOI) substrate, or a germanium-on-insulator (GOI) substrate. In the depicted embodiment, the substrate 102 may refer to an IC die. The substrate 102 has a low CTE. For example, a silicon substrate 102 may have a CTE about $2.6 \times 10^{-6}$ C.$^{-1}$. The first RDL layer 109 and the second RDL layer 113 may include copper (Cu). Copper has a CTE about $16 \times 10^{-6}$ C.$^{-1}$, which is about 5-6 times of that of the substrate 102. The polymer layer 104 may include polyimide (PI), polybenzoxazole (PBO), benzocyclobuten (BCB), epoxy, silicone, acrylates, nano-filled pheno resin, siloxane, fluorinated polymer, or polynorbornene. The polymer layer 104 has a much higher CTE than that of the substrate 102. For example, when the polymer layer 104 is formed of benzocyclobutene (BCB), it has a CTE about $52 \times 10^{-6}$ C.$^{-1}$, which is about 20 times of that of the substrate 102. Reference is made to FIG. 1. Because the CTE of the substrate 102 is much smaller than those of the polymer layer 104 and the metal features, it serves as a back plate or stress direction plate that directs the thermal expansion upward away from the substrate 102. The first RDL layer 109 is anchored in the middle to the first contact via 106, which leaves the first conductive pad 110 to flex and sustains the thermal stress from the first polymer layer 104-1 and the second polymer layer 104-2. Similarly, the second RDL layer 113 is only anchored to the first conductive pad 110 by way of the third contact via 112, which leaves the rest of the second conductive pad 114 to flex and sustain the thermal expansion from the third polymer layer 104-3. As a result, the first connecting pattern 100 is less prone to cracks in the metal features.

Figure 3:
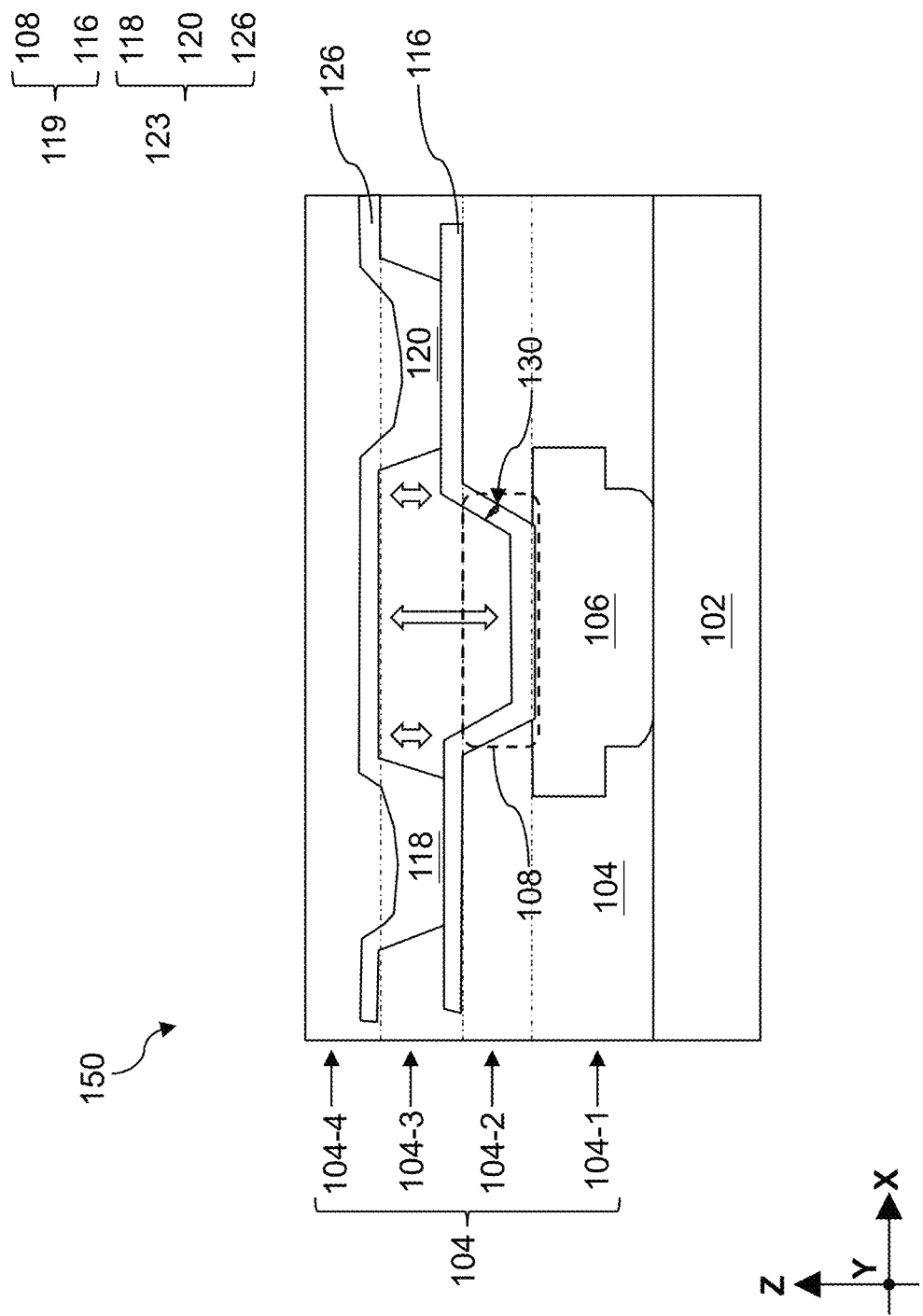
FIG. 3 is a fragmentary cross-sectional view of a second connecting pattern in an RDL structure that is more susceptible to cracks, according to various aspects of the present disclosure.
Figure 4:
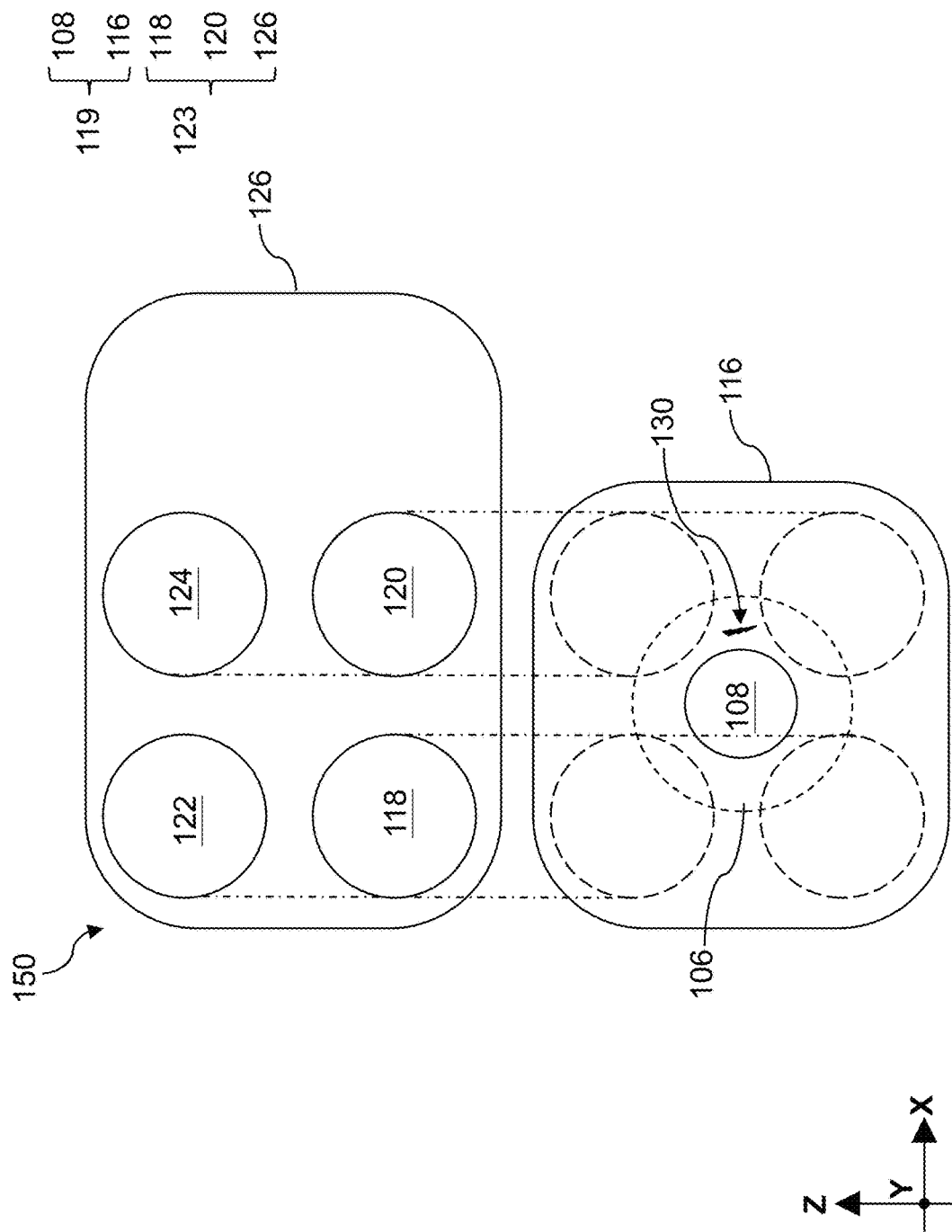
FIG. 4 illustrates fragmentary top views of redistribution layers in the second connection patterns in the RDL structure shown in FIG. 3, according to various aspects of the present disclosure.

The same cannot be said when a region of the polymer layer 104 is land-locked or confined by structures having a smaller CTE. FIGS. 3-4 illustrate a fragmentary cross-sectional view and layer-by-layer top view of a second connecting pattern 150. The second connecting pattern 150 in an RDL structure includes a substrate 102, a plurality of polymer layers 104 over the substrate 102, a first contact via 106 disposed over the substrate 102, a first enhanced RDL layer 119 over the first contact via 106, and a second enhanced RDL layer 123 over the first enhanced RDL layer 119. The first enhanced RDL layer 119 includes a first enhanced conductive pad 116 and a second contact via 108. The second enhanced RDL layer 123 includes a second enhanced conductive pad 126, a fourth contact via 118, a fifth contact via 120, a sixth contact via 122, and a seventh contact via 124. In the depicted embodiments, the plurality of polymer layer 104 includes a first polymer layer 104-1, a second polymer layer 104-2 over the first polymer layer 104-1, a third polymer layer 104-3 over the second polymer layer 104-2, and a fourth polymer layer 104-4 over the third polymer layer 104-3. As illustrated in FIG. 3, the second contact via 108 extends through the second polymer layer 104-2 to physically contact the first contact via 106. The fourth contact via 118, the fifth contact via 120, the sixth contact via 122, and the seventh contact via 124 extend through the third polymer layer 104-3 to physically contact the first enhanced conductive pad 116.

Referring to FIG. 4, both the first enhanced conductive pad 116 and the second enhanced conductive pad 126 are quadrilateral with rounded corners. For example, the first enhanced conductive pad 116 and the second enhanced conductive pad 126 may have a shape of a square, a rectangle, or an isosceles trapezoid, from a top view, depending on the locations and diameters of the contact vias landing thereon. As compared the first conductive pad 110 and the second conductive pad 114, both the first enhanced conductive pad 116 and the second enhanced conductive pad 126 are wider along the Y direction to accommodate more contact via connections. Along the vertical direction (Z direction), the second contact via 108 overlaps the first contact via 106. To ensure a proper process window, a vertical projection area of the second contact via 108 is smaller than and falls completely in a vertical projection of the first contact via 106. Along the vertical direction, The fourth contact via 118, the fifth contact via 120, the sixth contact via 122, and the seventh contact via 124 overlap the first enhanced conductive pad 116. In other words, vertical projections of the fourth contact via 118, the fifth contact via 120, the sixth contact via 122, and the seventh contact via 124 fall completely in the vertical projection of the first enhanced conductive pad 116.

The second connecting pattern 150 is configured to suit high current applications. Because of the increased number of contact vias and enlarged conductive pads, current is more spread out to prevent undesirable local resistive heating, which may lead to connection failures. The increased number of contact vias may, however, spatially confine regions of the polymer layer 104. Similar to the first connecting pattern 100 shown in FIG. 1, the low-CTE substrate 102 serves as a back plate or stress direction plate that directs the thermal expansion upward away from the substrate 102. The first enhanced RDL layer 119 is anchored in the middle to the first contact via 106, which leaves the rest of the first enhanced conductive pad 116 to flex and withstand the thermal stress from the first polymer layer 104-1 and the second polymer layer 104-2. The second enhanced RDL layer 123 is anchored to the first enhanced conductive pad 116 by way of the fourth contact via 118, the fifth contact via 120, the sixth contact via 122, and the seventh contact via 124. These four contact vias are compactly located and substantially anchor the second enhanced RDL layer 123 to the first enhanced conductive pad 116. As shown in FIG. 3, a region of the second polymer layer 104-2 and the third polymer layer 104-3 is geologically land-locked by the second contact via 108, the fourth contact via 118, the fifth contact via 120, the sixth contact via 122, and the seventh contact via 124. As shown by the two-headed-arrows, the stress generated by the confined region of the polymer layer 104 may produce stress that pushes the second enhanced RDL layer 123 away from the first enhanced RDL layer 119. It has been observed that such stress may cause cracks 130 around the second contact via 108.

The present disclosure provides methods to form stress release openings in redistribution layers to prevent generation of cracks and RDL structures that include such stress openings. Methods of the present disclosure may be implemented, for example, when expansion of a polymer layer in an RDL structure is land-locked or confined by RDL metal features, when such expansion is restricted by a semiconductor substrate having a low CTE, or both. When methods of the present disclosure are implemented, redistribution layers in an RDL structure may include different kinds of stress release openings. Such stress release openings may include over-via openings, via edge openings, and inter-via openings. As used herein, an over-via opening is disposed directly over a contact via, a via edge opening refers to an opening along an edge of a contact via, and an inter via opening refers to an opening disposed between two contact vias.

Figure 5:
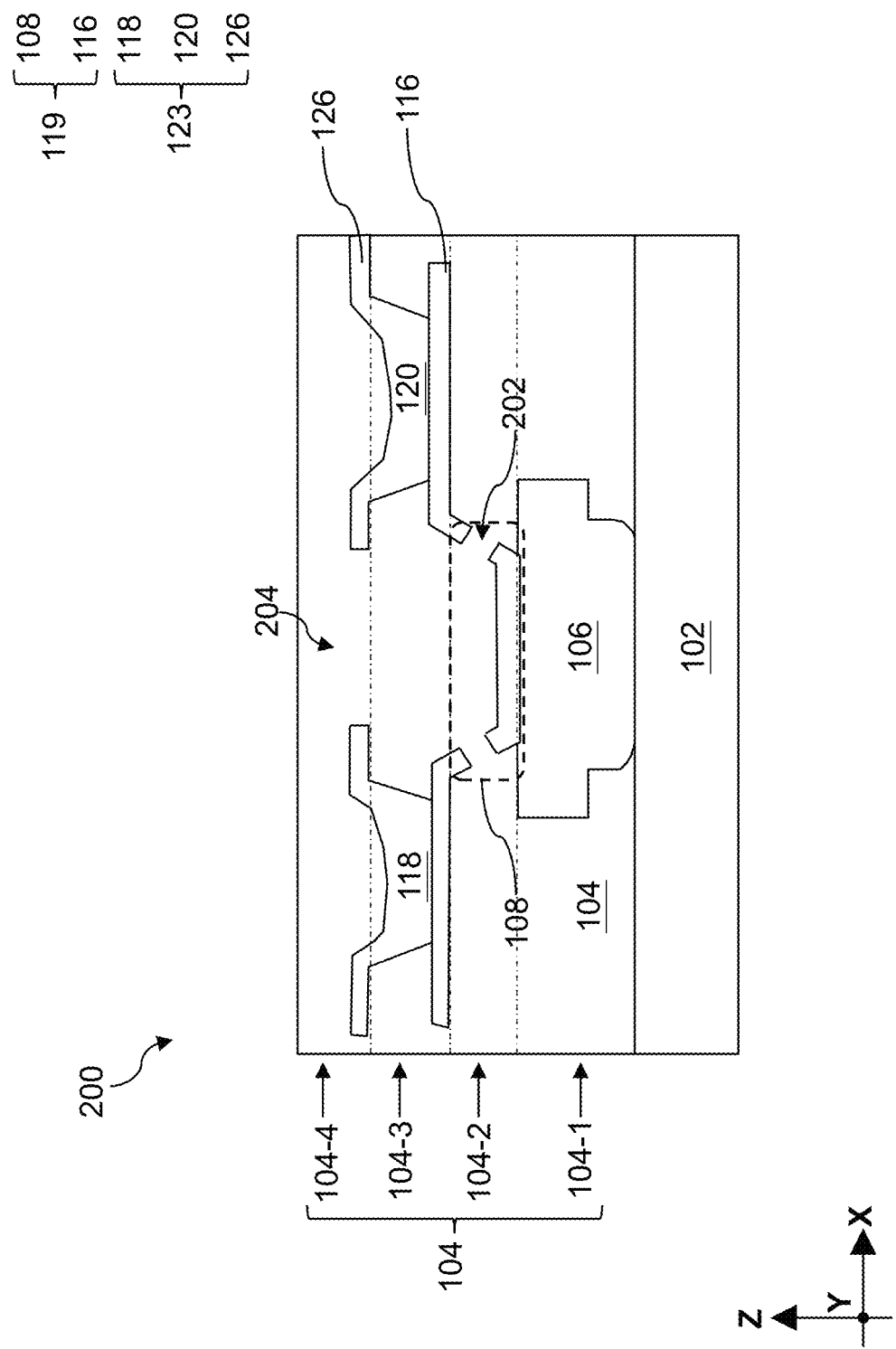
FIG. 5 is a fragmentary cross-sectional view of a first mesh connecting pattern in an RDL structure that includes stress release openings, according to various aspects of the present disclosure.
Figure 6:
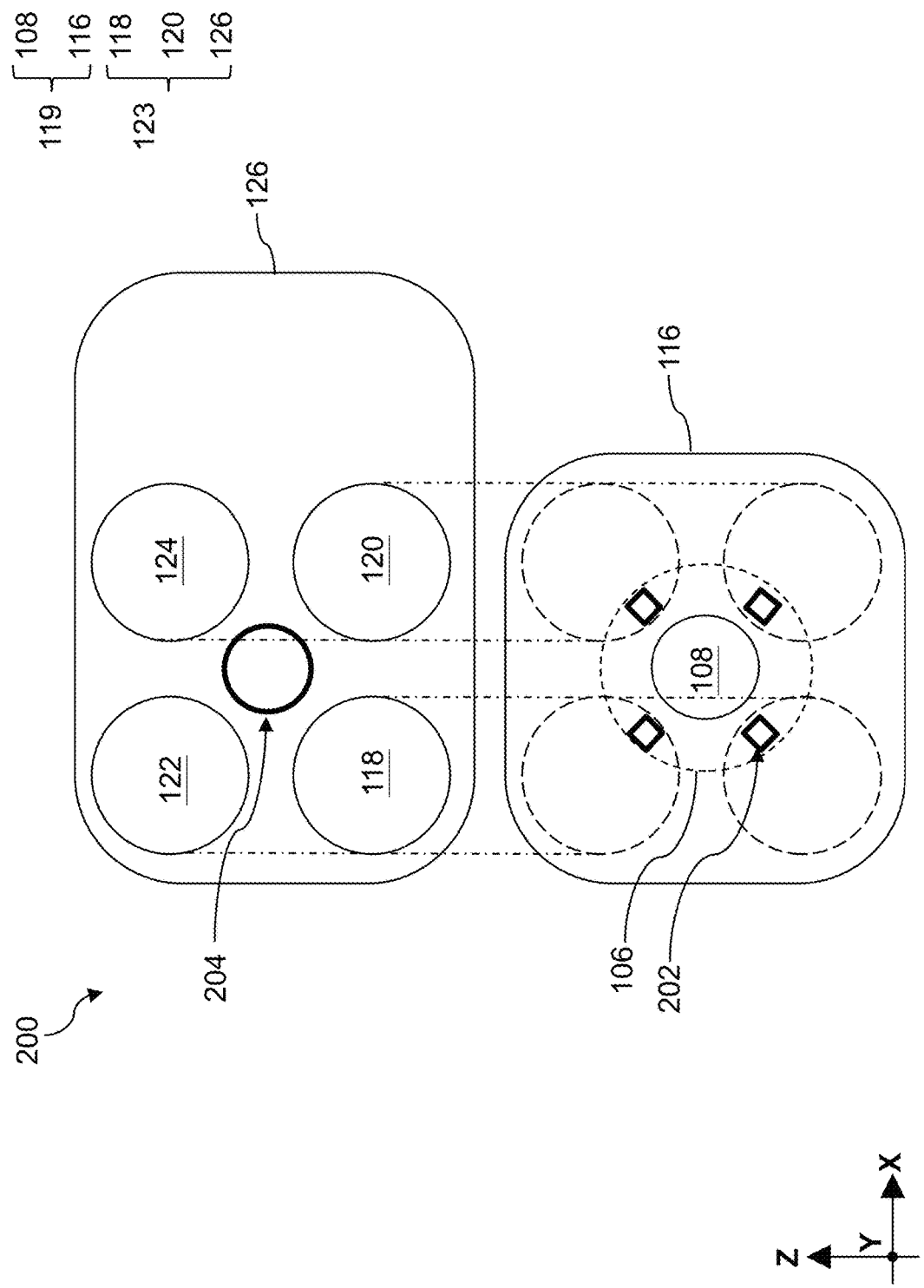
FIGS. 6-9 illustrate fragmentary top views of various examples of the first mesh connecting patterns in the RDL structure that includes stress release openings, according to various aspects of the present disclosure.

FIGS. 5 and 6 illustrate a fragmentary cross-sectional view and a layer-by-layer top view of a first mesh connecting pattern 200. Similar to the second connecting pattern 150, the first mesh connecting pattern 200 includes a substrate 102, a plurality of polymer layers 104 over the substrate 102, a first contact via 106 disposed over the substrate 102, a first enhanced RDL layer 119 over the first contact via 106, and a second enhanced RDL layer 123 over the first enhanced RDL layer 119. The first enhanced RDL layer 119 includes a first enhanced conductive pad 116 and a second contact via 108. The second enhanced RDL layer 123 includes a second enhanced conductive pad 126, a fourth contact via 118, a fifth contact via 120, a sixth contact via 122, and a seventh contact via 124. Different from the second connecting pattern 150, the first mesh connecting pattern 200 also includes first openings 202 and a second opening 204. The first openings 202 are via edge openings around a rim or an edge of the second contact via 108. The second opening 204 is an over-via opening that is directly over the second contact via 108. The first openings 202 and the second opening 204 are located around locations where the thermal stress from the polymer layer 104 is greatest or at a local maximum according to computer simulation results. In other words, the first openings 202 and the second opening 204 disrupt the confinement of the polymer layer 104 by the first enhancement RDL layer 119 and the second enhancement RDL layer 123 and release the thermal stress exerted by the polymer layer 104. In terms of their functions the first openings 202 and the second opening 204 are stress release openings or strain reduction openings.

The dimensions and locations of the first openings 202 and the second opening 204 are not trivial. While the first openings 202 can release stress as long as they are located around a rim or an edge of the second contact via 108, they are more effective if they vertically overlap both a vertical projection area of the first contact via 106 and one of the fourth contact via 118, the fifth contact via 120, the sixth contact via 122, and the seventh contact via 124. In the depicted embodiment where there is one first contact via 106 and four contact vias in the second enhancement RDL layer 123, the first mesh connecting pattern 200 includes four first openings 202 to effectively reduce the stress. As shown in FIG. 6, each of the four first openings 202 falls within an overlapping area of the first contact via 106 and one of the fourth contact via 118, the fifth contact via 120, the sixth contact via 122, and the seventh contact via 124. In some embodiments, each of the first openings 202 is rectangular in shape and each edge has a dimension between about 4 μm and about 6 μm. This size is not trivial. When this dimension is smaller than 4 μm, photolithography technique that is associated with a higher cost has to be used, which is going to increase the cost. When this dimension is too large, the first openings 202 may unduly reduce the conduction area of the first enhanced RDL layer 119, resulting in increased resistance. The second opening 204 may be circular in shape and may have a dimension similar to that of the second contact via 108. For example, when the second contact via 108 is circular and has a diameter D, the second opening 204 has a diameter between about 0.9 D and about 1.1 D. When the second opening 204 is substantially smaller than the second contact via 108, it may not sufficiently release the stress. When the second opening 204 is much larger than the second contact via 108, it may reduce conduction area of the second enhanced RDL layer 123, resulting in increased resistance.

Figure 7:
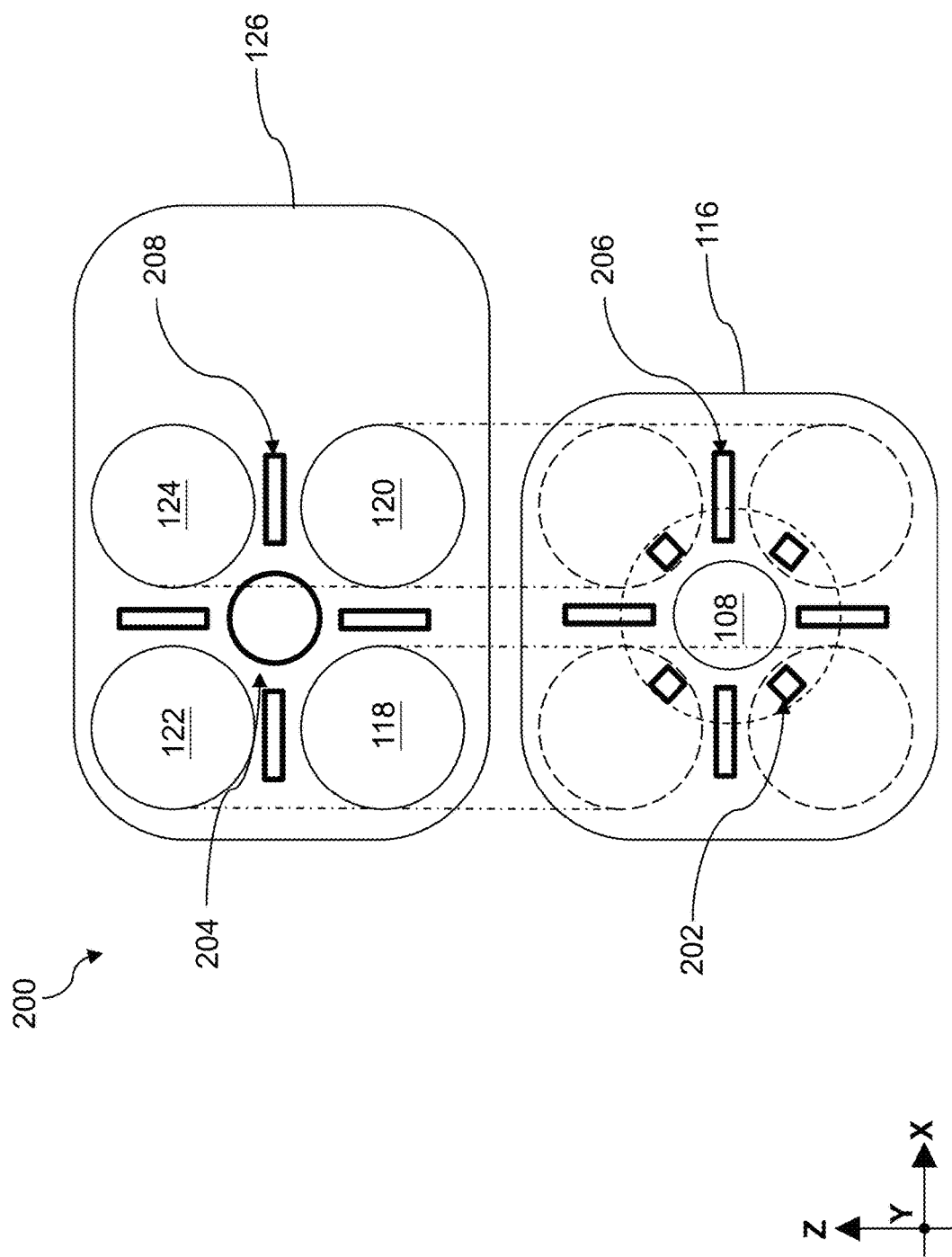

In cases where resistance is less a concern and more safety margin is desired, third openings 206 and fourth openings 208 shown in FIG. 7 may be implemented. The third openings 206 and the fourth openings 208 are inter-via openings as they are disposed between two contact vias. The third openings 206 are each disposed between two landing areas of the fourth contact via 118, the fifth contact via 120, the sixth contact via 122, and the seventh contact via 124 on the first enhanced conductive pad 116. The fourth openings 208 are each disposed between two of the fourth contact via 118, the fifth contact via 120, the sixth contact via 122, and the seventh contact via 124. The third openings 206 are formed in the first enhanced RDL layer 119. The fourth openings 208 are formed in the second enhanced RDL layer 123.

Different from the first openings 202 and the second opening 204, the third openings 206 and the fourth openings 208 are elongated to disrupt the land-locked confinement due to the close placement of two contact vias. Each of the third openings 206 and the fourth openings 208 has a width between about 4 µm and about 6 µm and a length between about 20 µm and about 40 µm. When the width is smaller than 4 µm, the process window may be small or a more costly process is required. When the width is greater than 6 µm, pad resistance may increase. The length of the third openings 206 and the fourth openings 208 depends on the size of the contact vias. Generally speaking, the length of the third openings 206 and the fourth openings 208 increases with a diameter of the contact vias.

Figure 8:
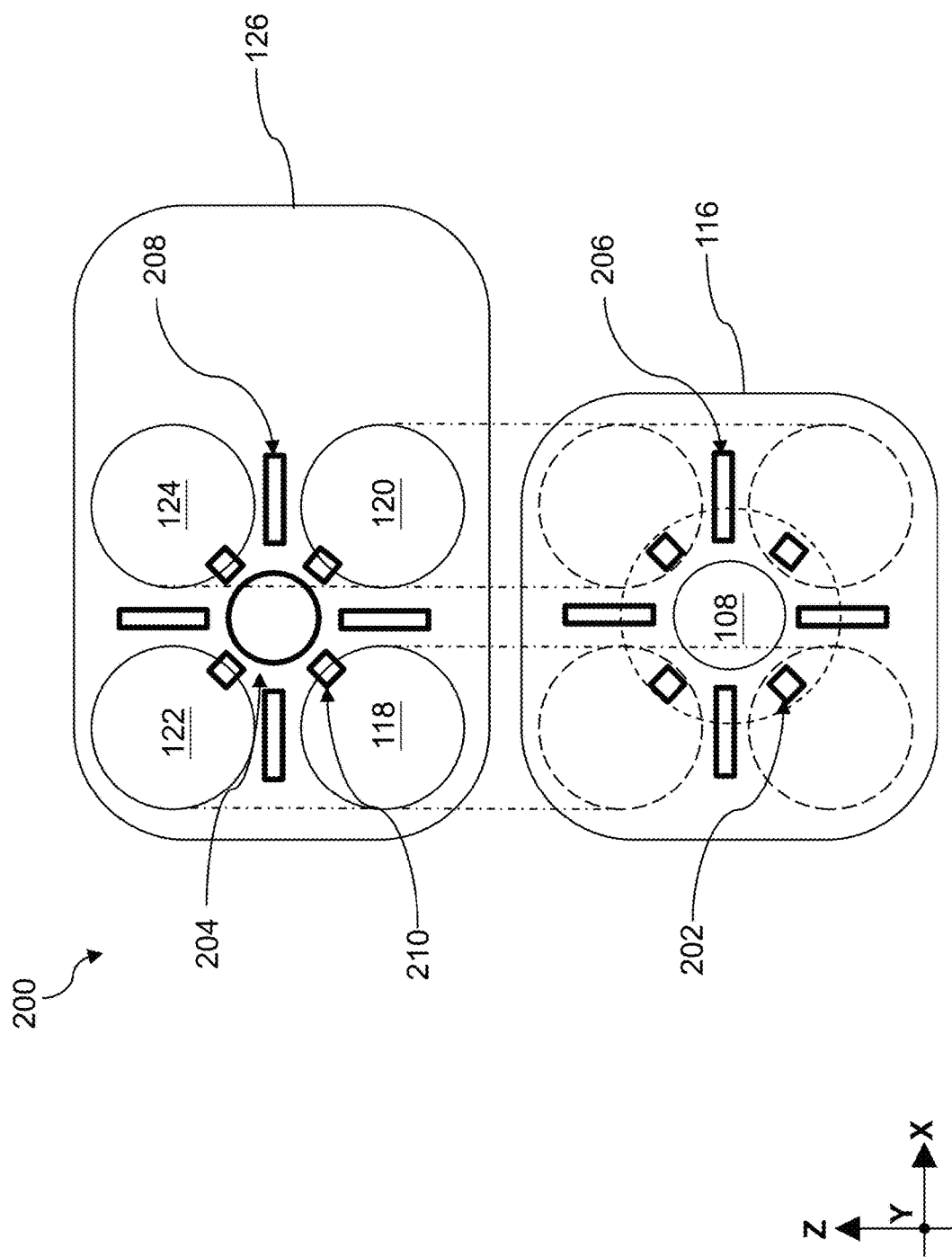
Figure 9:
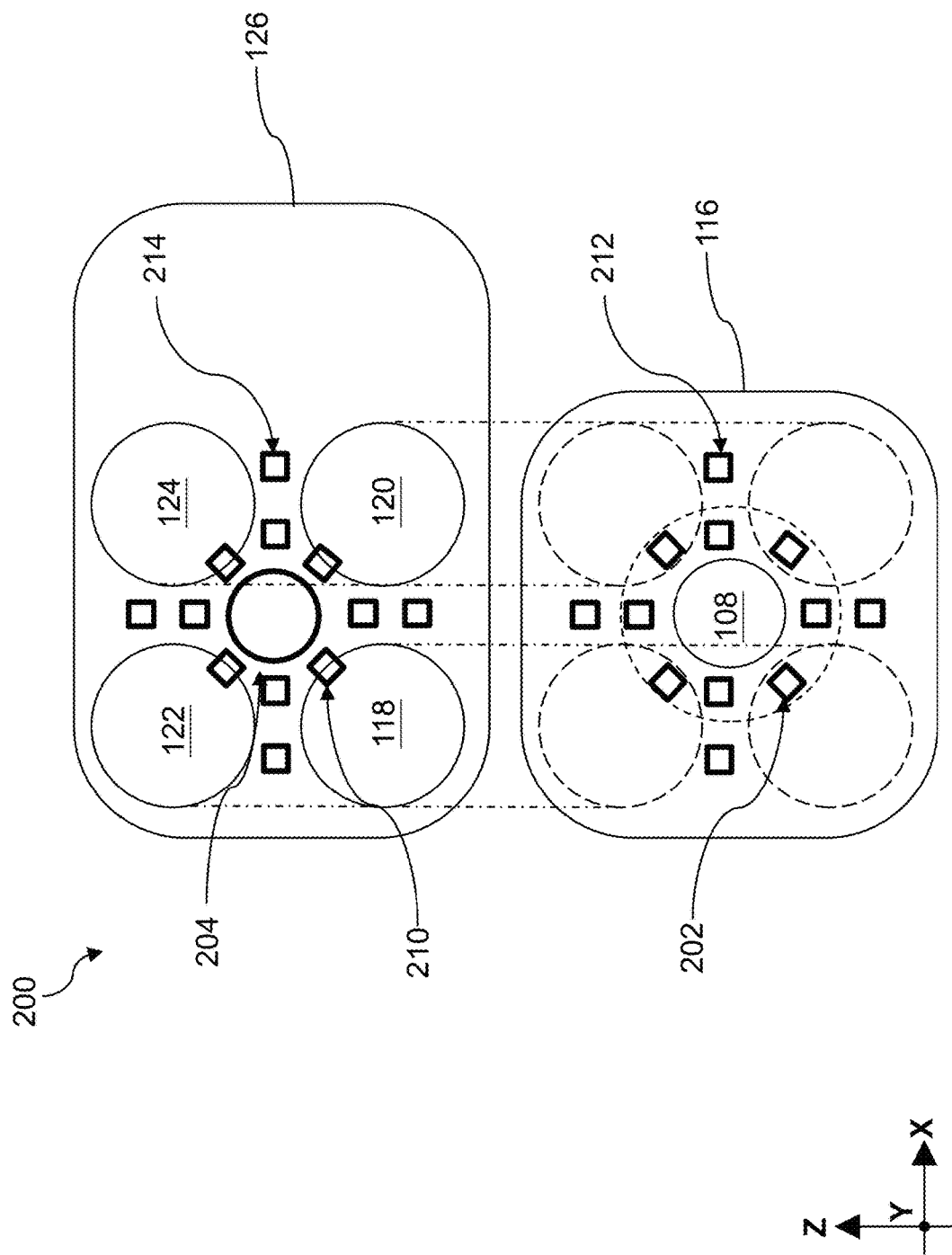

FIG. 8 illustrates an alternative embodiment where via edge openings (fifth openings 210) are also formed in the second enhanced RDL layer 123 to further reduce the thermal stress from the polymer layer 104. FIG. 9 illustrates a variant of the inter-via openings shown in FIGS. 7 and 8. In the embodiment represented in FIG. 9, each of the third openings 206 and the fourth openings 208 is replaced with at least two smaller sixth openings 212 or seventh openings 214.

Figure 10:
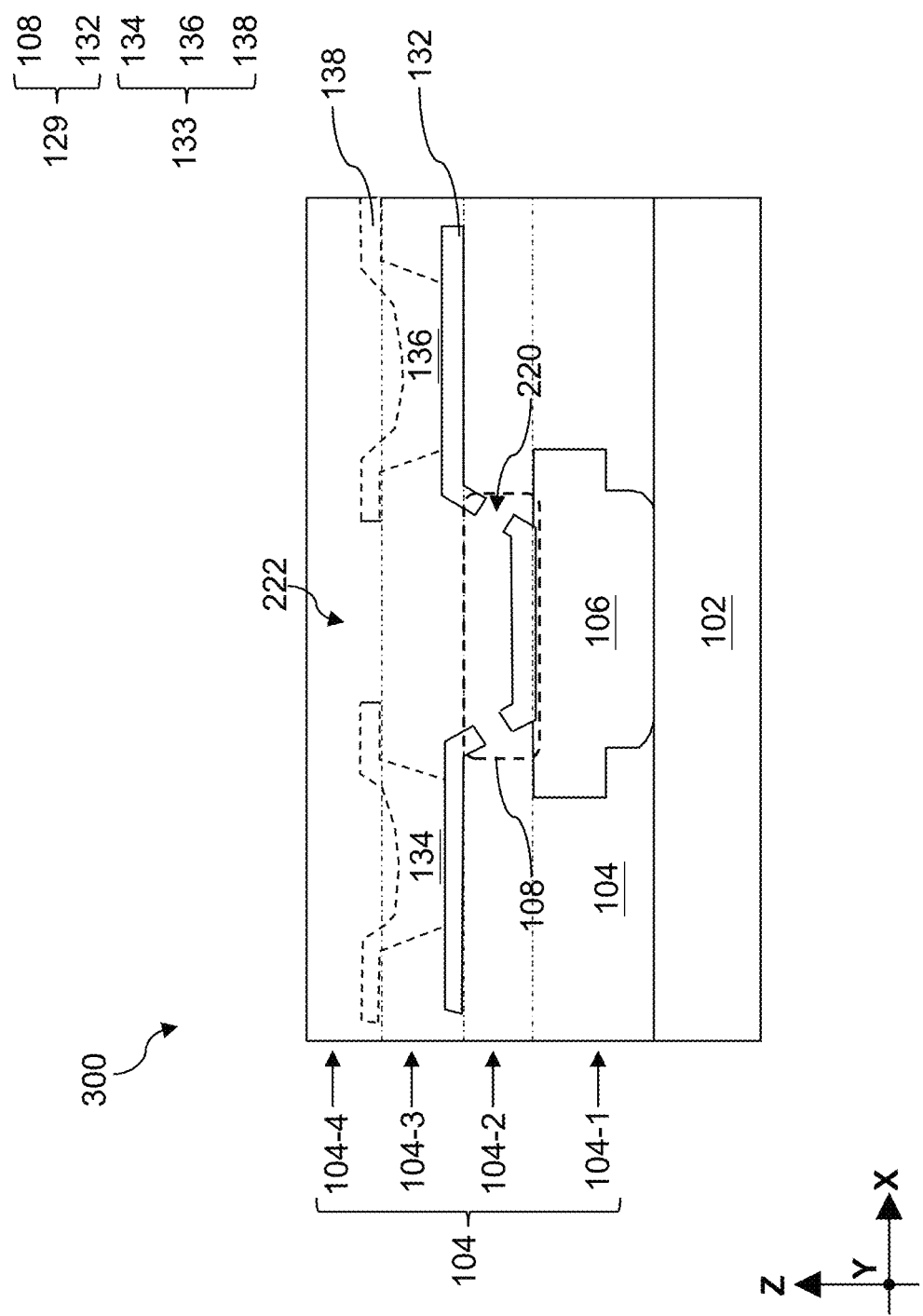
FIG. 10 is a fragmentary cross-sectional view of a second mesh connecting pattern in an RDL structure that includes stress release openings, according to various aspects of the present disclosure.
Figure 11:
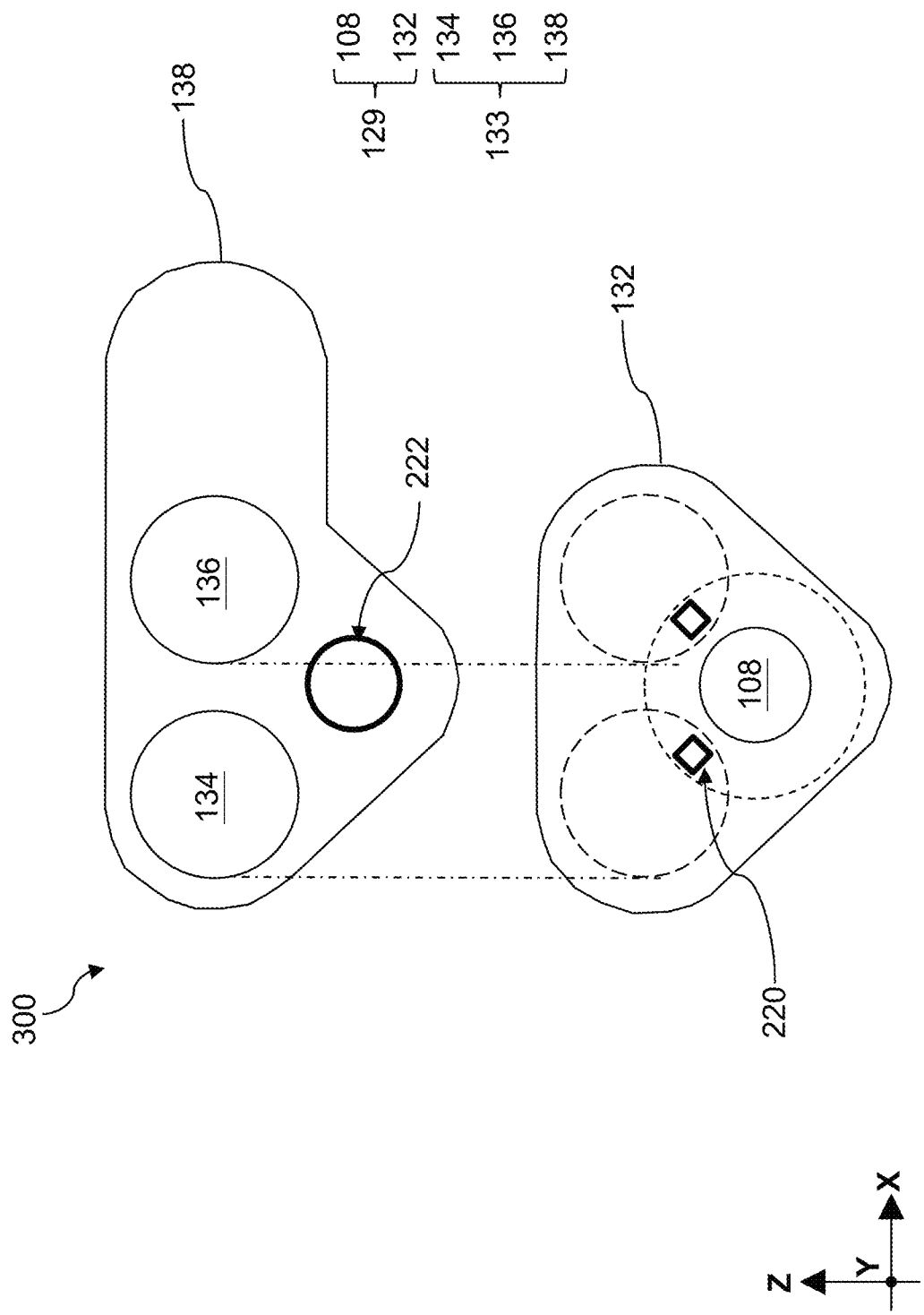
FIGS. 11-13 illustrate fragmentary top views of various examples of the second mesh connecting patterns in the RDL structure that includes stress release openings, according to various aspects of the present disclosure.

The stress release openings of the present disclosure may be implemented in other connecting patterns. Reference is now made to FIGS. 10 and 11, which illustrate a cross-sectional view and a layer-by-layer top view of a second mesh connecting pattern 300. The second mesh connecting pattern 300 includes a substrate 102, a plurality of polymer layers 104 over the substrate 102, a first contact via 106 disposed over the substrate 102, a first supplemental RDL layer 129 over the first contact via 106, and a second supplemental RDL layer 133 over the first supplemental RDL layer 129. The first supplemental RDL layer 129 includes a first supplemental conductive pad 132 and a second contact via 108. The second supplemental RDL layer 133 includes a second supplemental conductive pad 138, an eighth contact via 134 and a ninth contact via 136. As shown in FIG. 11, the first supplemental conductive pad 132 has a triangular shape where the second contact via 108 is off-centered. The second supplemental conductive pad 138 includes a triangular area corresponding to the first supplemental conductive pad 132 and a lateral extension along the X direction. The eighth contact via 134 and the ninth contact via 136, although not surrounding the vertical projection area of the second contact via 108, are adjacent to it.

In the embodiment illustrated in FIGS. 10 and 11, the second mesh connecting pattern 300 includes eighth openings 220 in the first supplemental RDL layer 129 and a ninth opening 222 in the second supplemental RDL layer 133. The eighth openings 220 are via edge openings, similar to the first openings 202 shown in FIG. 6. The ninth opening 222 is an over-via opening, similar to the second opening 204 shown in FIG. 6. The eighth openings 220 are disposed along the edge of the second contact via 108 and are within an overlapping area between the vertical projection area of the first contact via 106 and the vertical projection area of the eighth contact via 134 or the ninth contact via 136. In the depicted embodiments, the second mesh connecting pattern 300 includes two eighth openings 220. The ninth opening 222 is disposed directly over the second contact via 108.

Figure 12:
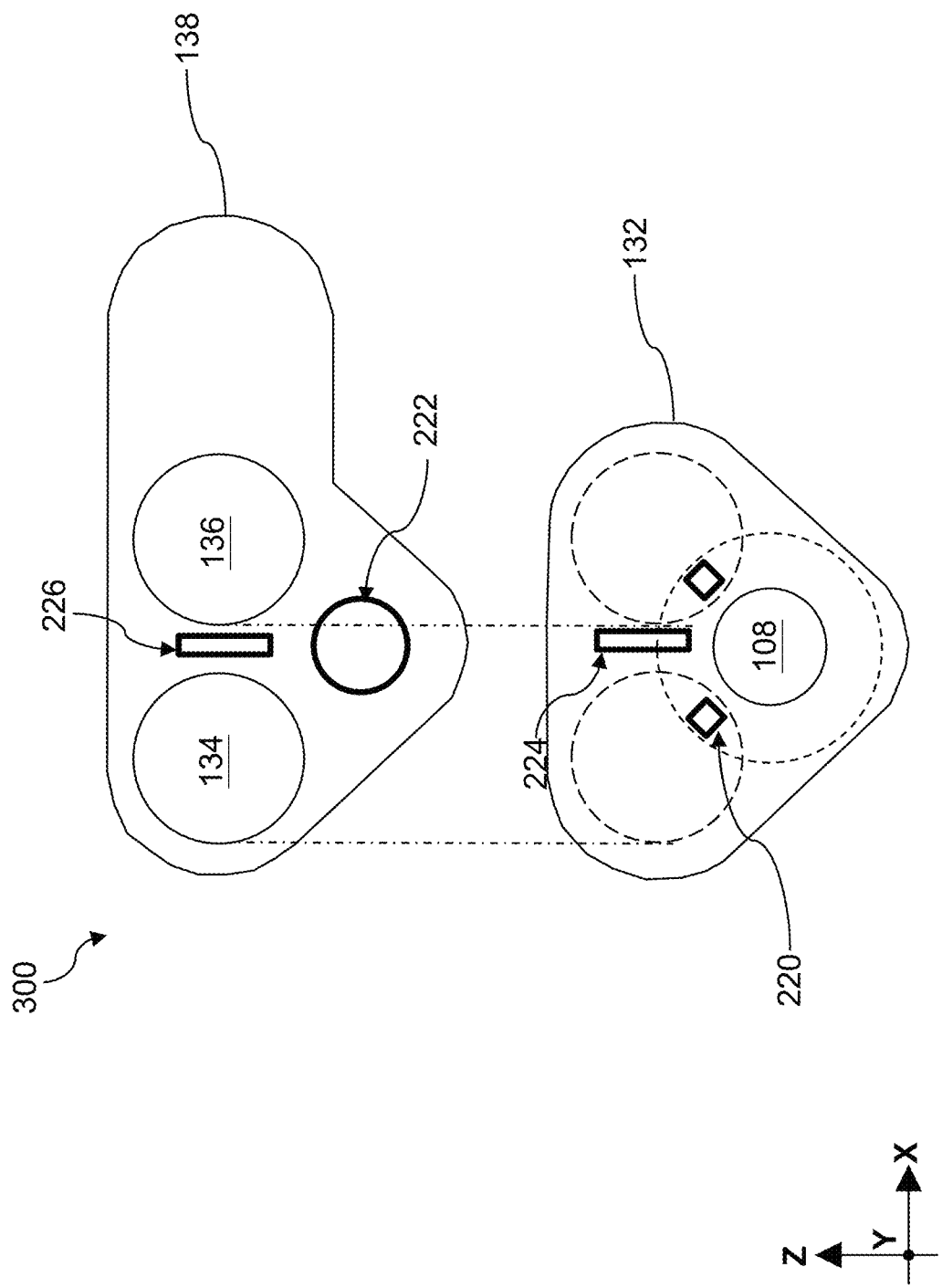
Figure 13:
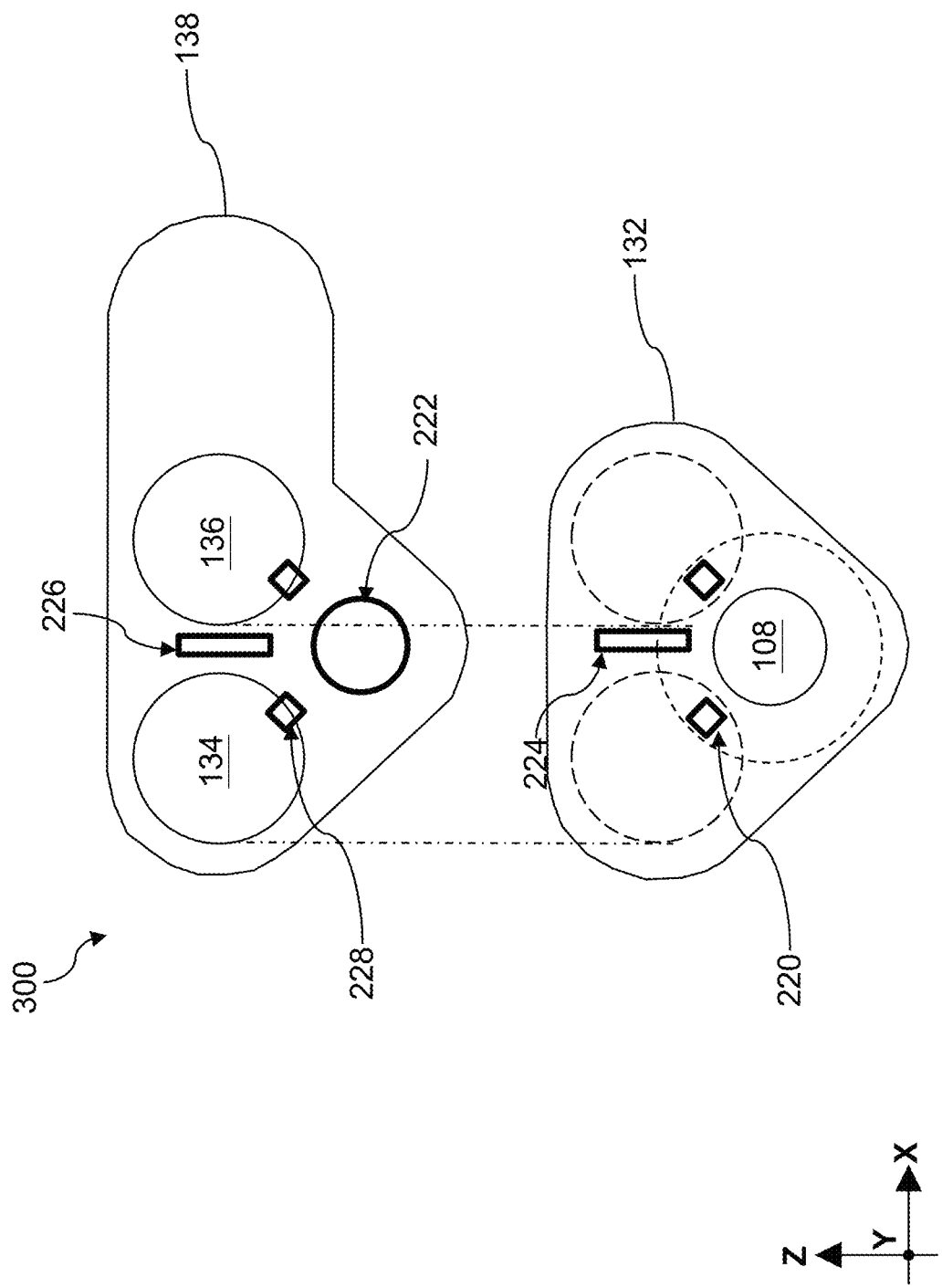

FIGS. 12 and 13 illustrate alternative embodiments that further include inter-via openings and further via edge openings. In some alternative embodiments represented in FIG. 12, the second mesh connecting pattern 300 further includes a tenth opening 224 in the first supplemental RDL layer 129 and an eleventh opening 226 in the second supplemental RDL layer 133. The tenth opening 224 and the eleventh opening 226 are inter-via openings. The tenth opening 224 is disposed directly between vertical projection areas of the eighth contact via 134 and the ninth contact via 136 on the first supplemental RDL layer 129. The eleventh opening 226 is disposed directly between the eighth contact via 134 and the ninth contact via 136 in the second supplemental RDL layer 133. Similar to the third openings 206 and the fourth opening 208 in FIG. 8, the tenth opening 224 and the eleventh opening 226 operate to disrupt the confinement of the first supplemental RDL layer 129 and the second supplemental RDL layer 133. The alternative embodiments represented in FIG. 13 further includes twelfth openings 228, which are via edge openings formed around the rim or edge of the eighth contact via 134 and the ninth contact via 136. The twelfth openings 228 are disposed between the eighth contact via 134 and the ninth opening 222 (i.e., an over-via opening) and between the ninth contact via 136 and the ninth opening 222.

Figure 14:
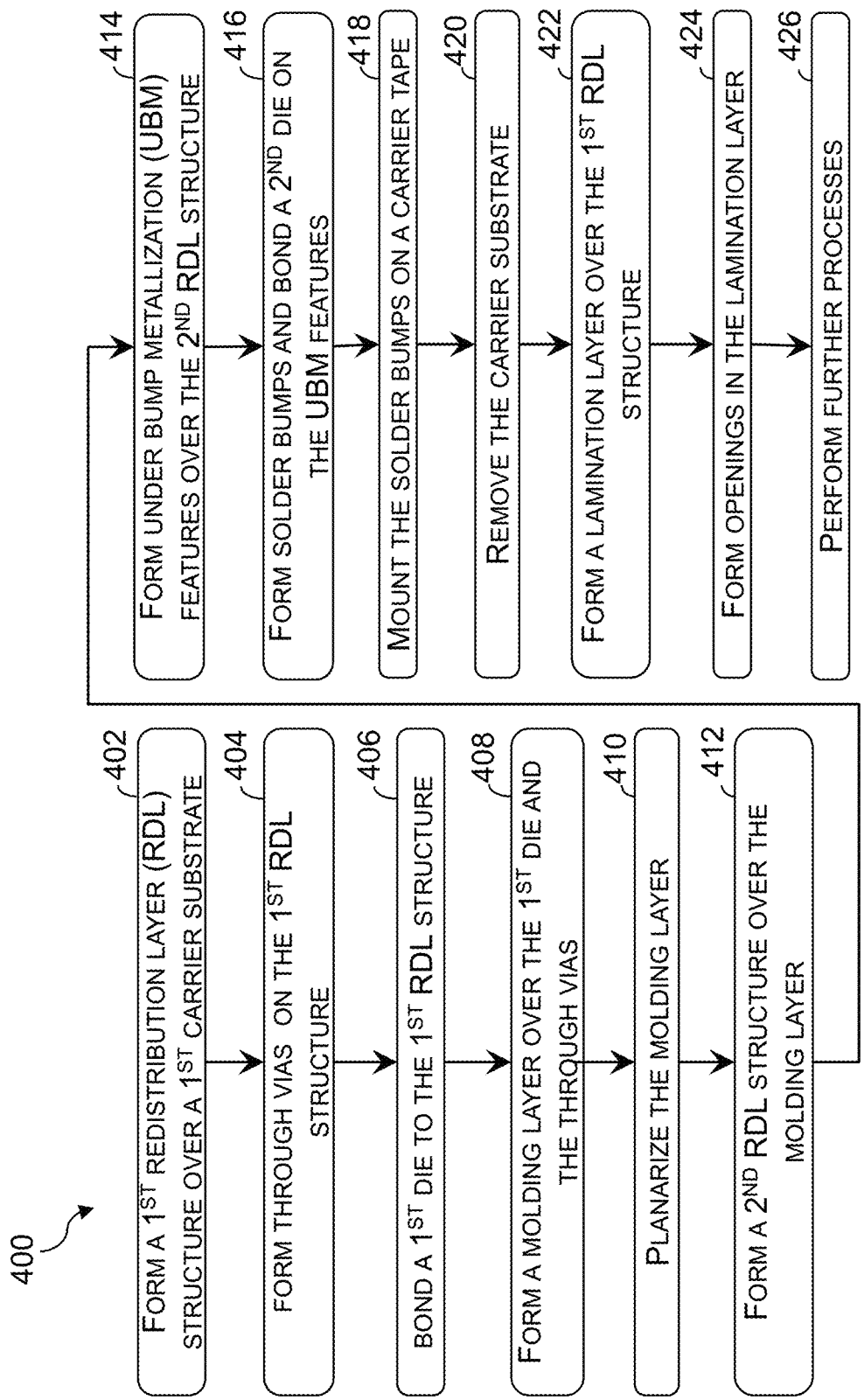
FIG. 14 is a flow chart of a method for forming a device package, according to various aspects of the present disclosure.

The connecting patterns described above many appear in RDL structures of device package. In some instances, a device package, such as an integrated fan-out (InFO) package, may include a frontside redistribution structure and a backside redistribution structure. The stress release openings of the present disclosure may be implemented to the frontside RDL structure, the backside RDL structure, or both, when a region of a polymer layer is land-locked or confined. FIG. 14 is a flowchart illustrating method 400 of forming a device package that includes stress release openings according to the present disclosure. Method 400 is merely an example and is not intended to limit the present disclosure to what is explicitly illustrated in method 400. Additional steps may be provided before, during and after the method 400, and some steps described can be replaced, eliminated, or moved around for additional embodiments of the method. Not all steps are described herein in detail for reasons of simplicity. Operations in method 400 are described below in conjunction with FIGS. 15-25, which are fragmentary cross-sectional view of a workpiece 500 at various stages of fabrication. Because the workpiece 500 will be fabricated into a device package as the context requires. Additionally, throughout the present application, like reference numerals denote like features, unless otherwise excepted. The X, Y and Z directions are used consistently in FIGS. 15-25 and are perpendicular to one another.

Figure 15:
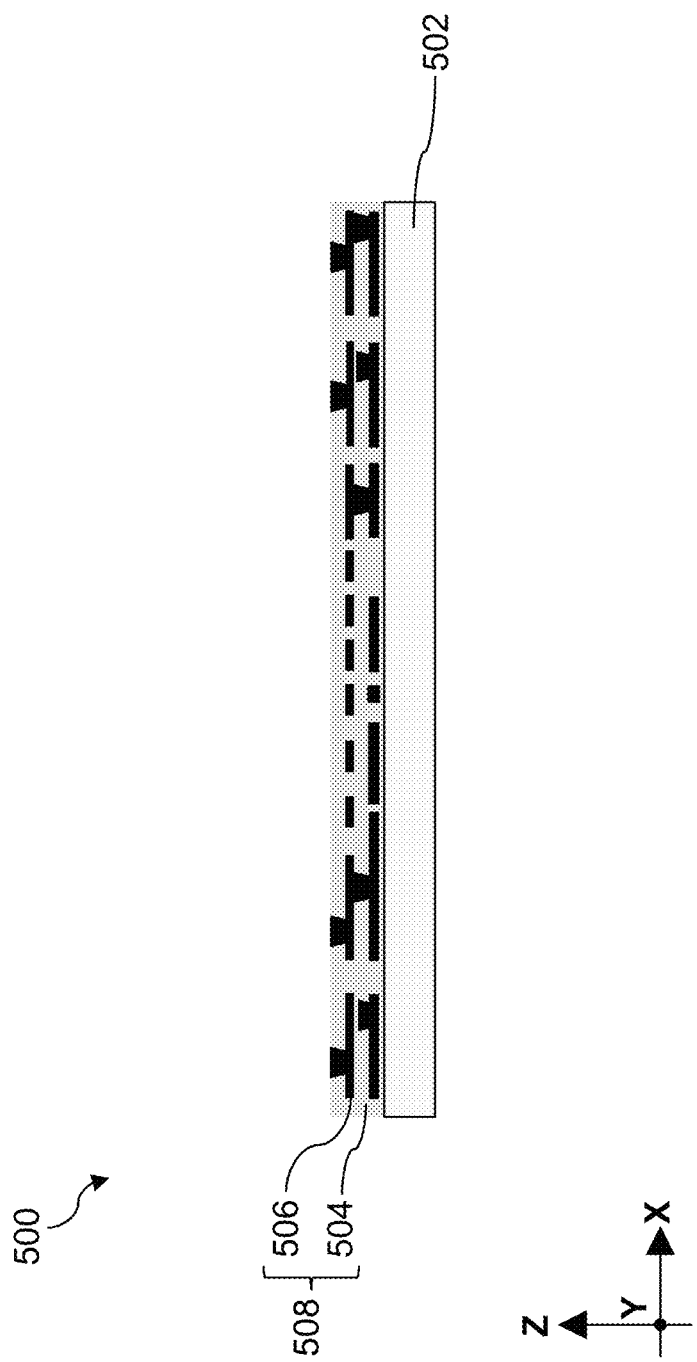
FIGS. 15-25 are fragmentary cross-sectional views of a workpiece undergoing various operations of the method of FIG. 14, according to various aspects of the present disclosure.

Referring to FIGS. 14 and 15, method 400 includes a block 402 where a first redistribution layer (RDL) structure 508 is formed over a carrier substrate 502. The carrier substrate 502 may include glass, ceramic, or other suitable material. The carrier substrate 202 provides structural support during the formation of various features on the workpiece 500. Although not explicitly shown, an adhesive layer (e.g., a glue layer, a light-to-heat conversion (LTHC) coating, an ultraviolet (UV) film, and the like) is disposed over the carrier substrate 502. The adhesive layer allows subsequent removal of the carrier substrate 502 from the workpiece 500. Thereafter, the first RDL structure 508 is formed over the adhesive layer. The first RDL structure 508 may include two (2) to five (5) RDL layers 506 embedded in a plurality of polymer layers 504. As described above in conjunction with FIGS. 1-13, the RDL layers 506 in the first RDL structure 508 may include copper (Cu) and the plurality of polymer layers may include polyimide (PI), polybenzoxazole (PBO), benzocyclobuten (BCB), epoxy, silicone, acrylates, nano-filled pheno resin, siloxane, fluorinated polymer, or polynorbornene. In an example process to form the first RDL structure, one of the polymer layers 504 is deposited using spin-on coating. The deposited polymer layer 504 is then patterned to form via openings using photolithography and etch techniques. After the patterning, a metal layer is then deposited over the patterned polymer layer 504 using physical vapor deposition (PVD) or electroplating. When the latter is adopted, a seed layer is first deposited over the patterned polymer layer 504 before a bulk of the RDL layer is formed using electroplating. The process is then repeated a number of times to form the first RDL structure 508. As will be described further below, the first RDL structure 508 is bonded to a back side of an IC die. For that reason, the first RDL structure 508 may also be referred to as a backside RDL structure 508. While it is possible that the stress release openings are formed in the first RDL structure 508 to reduce crack formation, the first RDL structure 508 illustrated in FIG. 15 does not implement a high current design. For that reason, the polymer layers 504 in the first RDL structure 508 may not include land-locked or confined regions that require stress release openings described above in conjunction with FIGS. 5-13.

Figure 16:
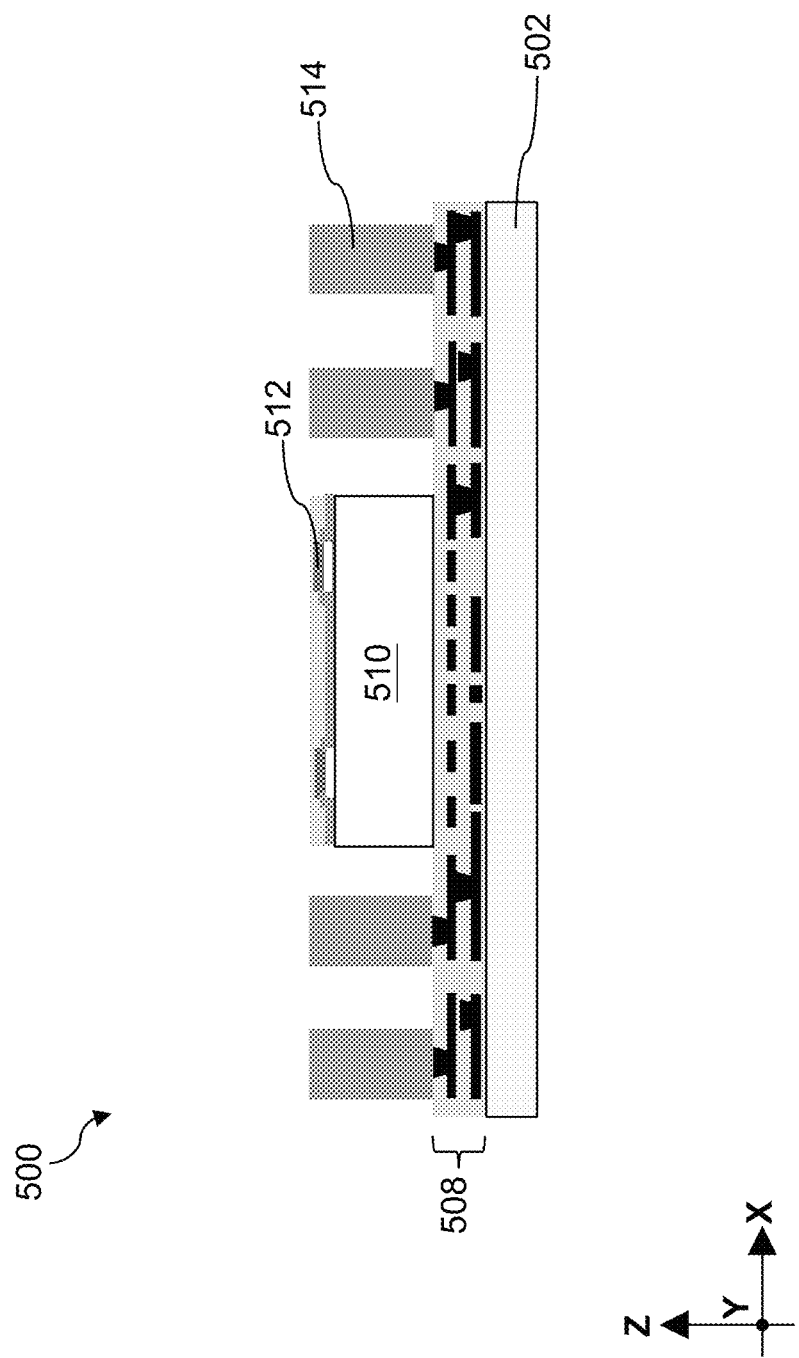

Referring to FIGS. 14 and 16, method 400 includes a block 404 where through vias 514 are formed over the first RDL structure 508. In one embodiment, the through vias 514 include copper. In an example process, a patterned photoresist is formed over the first RDL structure 508. To form the patterned photoresist, a photoresist is blanketly deposited over the first RDL structure 508. After a pre-exposure bake, the photoresist is exposed to radiation transmitting through or reflected by a photo mask. After a post-exposure bake, exposed or unexposed portions of photoresist are then developed/removed depending on whether a negative or positive resist is used. The resulting patterned photoresist may include openings for the through vias 514, which may be disposed at peripheral areas of the carrier substrate 502. The openings in the patterned photoresist expose conductive features or contact pads in first RDL structure 508. A conductive material such as copper, cobalt, nickel, or titanium is then deposited in the openings to form the through vias 514. In an example process, a seed layer is first deposited over the openings and then a plating process, such as an electroplating process or an electroless plating process, is performed to form the rest of the through vias 514. After the plating process, a planarization process is performed to remove excess materials over the patterned photoresist. The patterned photoresist is then removed using an ashing or a cleaning process. As will be described further below, the through vias 514 extend through an insulative encapsulation layer to conduct signals to a front side of an IC die. For that reason, the through vias 514 may also be referred to as through insulation vias (TIVs) 514.

Referring to FIGS. 14 and 16, method 400 includes a block 406 where an IC die 510 is bonded to the first RDL structure 508. The IC die 510 may be high bandwidth memory (HBM) die or a logic die. As shown in FIG. 16, the IC die 510 includes a plurality of contact pads 512 embedded in one or more passivation layers, which include a dielectric material or a polymeric material. Although not explicitly shown, a die attachment film (DAF) may be used to bond or affix the IC die 510 to a center region of the first RDL structure 508 such that the through vias 514 generally surround the attached IC die 510. While FIG. 16 only illustrates bonding of the IC die 510, more than one die may be bonded to the first RDL structure 508 at block 406. Detailed illustrations and descriptions are omitted for brevity. At this point, top surfaces of the IC die 510 and the through vias 514 may not be coplanar.

Figure 17:
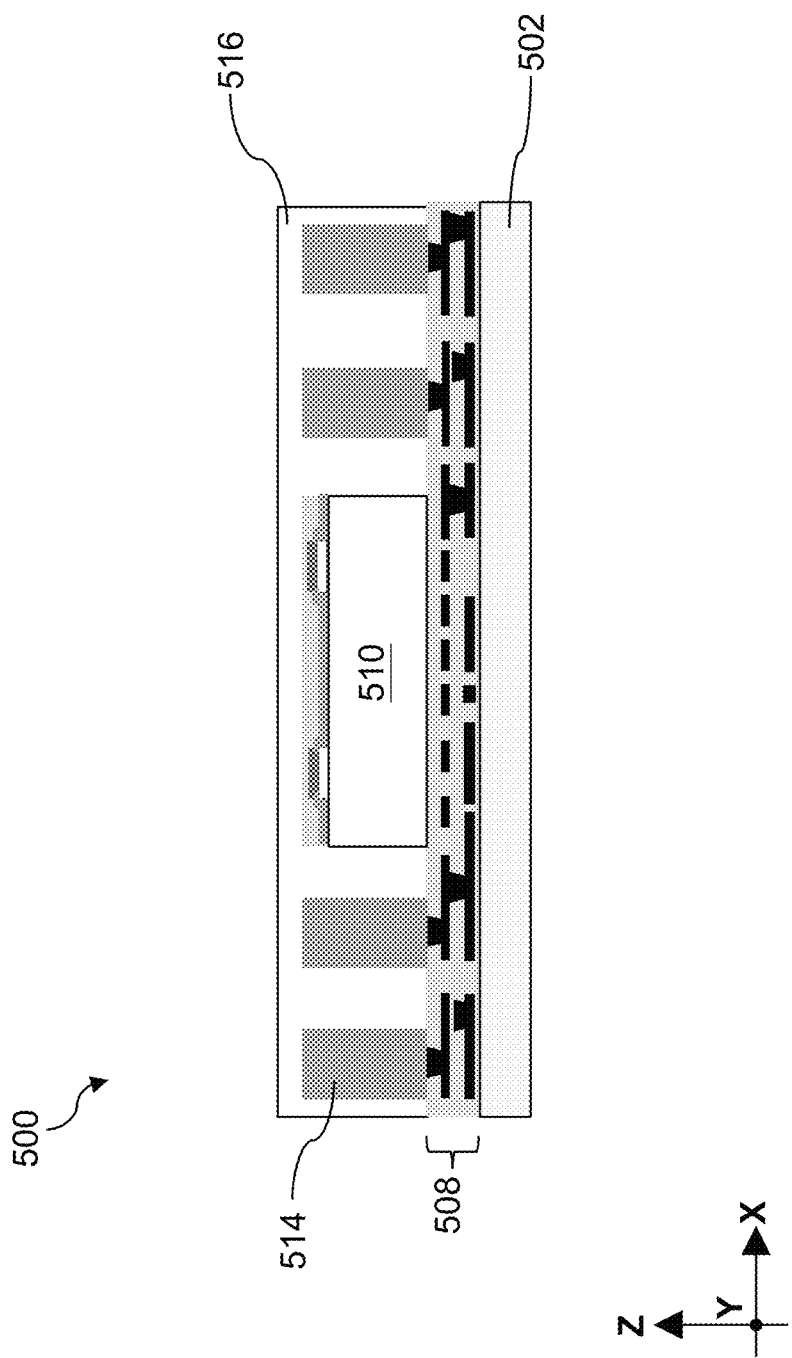

Referring to FIGS. 14 and 17, method 400 includes a block 408 where a molding layer 516 is formed over the IC die 510 and the through vias 514. A molding layer 516 (or a molding compound 516) may be formed using compressive molding, transfer molding, liquid encapsulant molding, and the like. For example, the molding layer 516 may be dispensed between IC die 510 and the through vias 514 or among the through vias 514 in liquid form. Subsequently, a curing process is performed to solidify the molding layer 516. As shown in FIG. 17, the molding layer 516 is dispensed until a top surface of the molding compound 516 is higher than top surfaces of the IC die 510 and the through vias 514. The molding layer 516 may include any suitable material such as an epoxy resin, a molding underfill, and the like.

Figure 18:
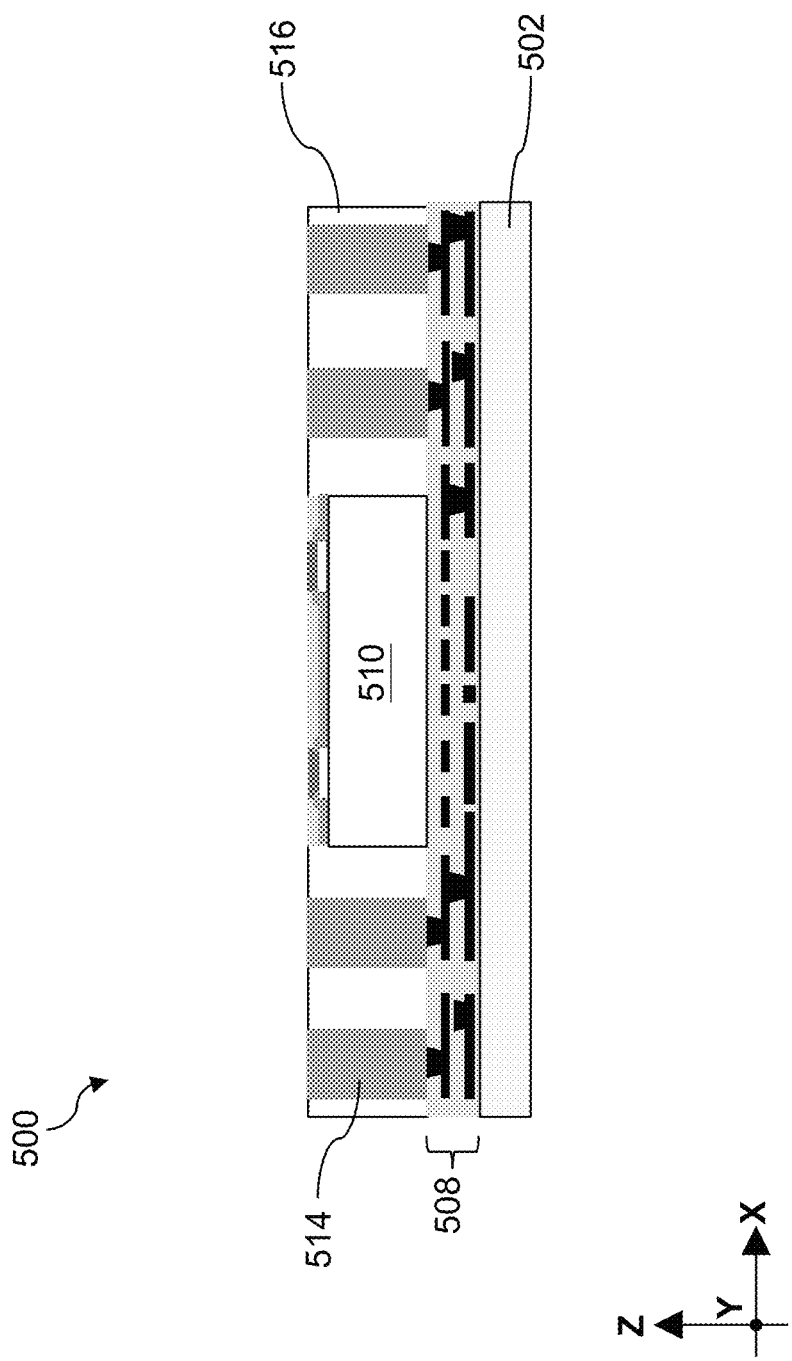

Referring to FIGS. 14 and 18, method 400 includes a block 410 where the molding layer 516 is planarized. At block 410, the cured molding layer 516 is planarized (e.g., using CMP, grinding, or the like) to reduce its overall thickness and thus expose through vias 514 and the plurality of contact pads 512 on the IC die 510. As described above, because the through vias 514 extend completely through the molding layer 516, the through vias 514 may also be referred to as through insulation vias (TSVs) 514 or through molding vias (TMVs) 514. Due to the planarization at block 410, top surfaces of the IC die 510 and the through vias 514 are coplanar.

Figure 19:
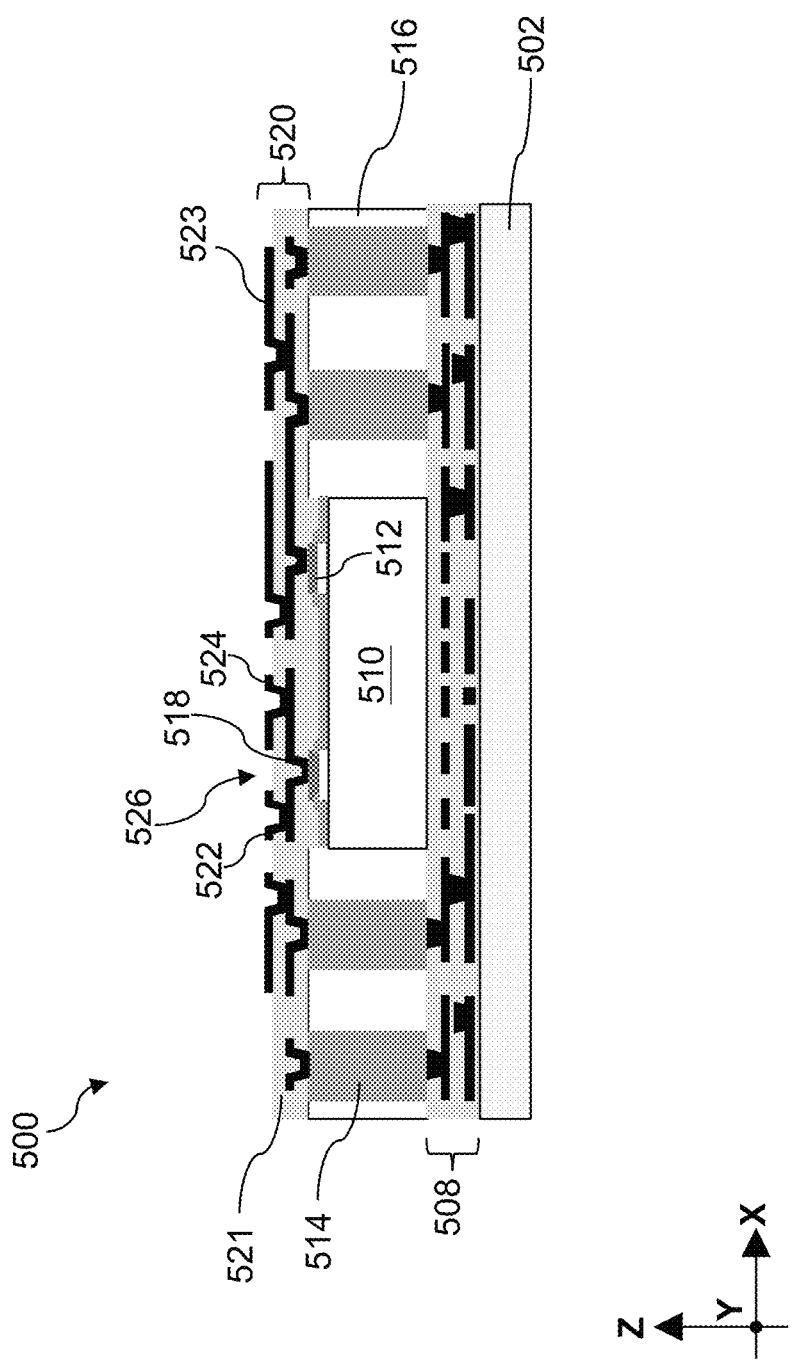

Referring to FIGS. 14 and 19, method 400 includes a block 412 where a second RDL structure 520 is formed over the workpiece 500. The second RDL structure 520 may include more RDL layer than the first RDL structure 508 because the second RDL structure 520 is coupled to not only to the through vias 514 but also contact pads 512 of the IC die 510. In some instances, the second RDL structure 520 may include three (3) to six (6) RDL layers 523 embedded in a plurality of polymer layers 521. As described above in conjunction with FIGS. 1-13, the RDL layers 523 in the second RDL structure 520 may include copper (Cu) and the plurality of polymer layers 521 may include polyimide (PI), polybenzoxazole (PBO), benzocyclobuten (BCB), epoxy, silicone, acrylates, nano-filled pheno resin, siloxane, fluorinated polymer, or polynorbornene. In an example process to form the second RDL structure 520, one of the polymer layers 521 is deposited using spin-on coating. The deposited polymer layer 521 is then patterned to form via openings using photolithography and etch techniques. After the patterning, a metal layer is then deposited over the patterned polymer layer 521 using physical vapor deposition (PVD) or electroplating. When the latter is adopted, a seed layer is first deposited over the patterned polymer layer 521 before a bulk of the RDL layer is formed using electroplating. The process is then repeated a number of times to form the first RDL structure 508. In the embodiment illustrated in FIG. 19, stress release openings of the present disclosure are implemented to the second RDL structure 520. At least one release opening, which is represented by an over-via opening 526 in FIG. 19, is formed in the RDL layer that includes the contact vias 522 and 524. The over-via opening 526 is disposed directly over an underlying contact via 518. Other stress release openings, including those described and shown in FIGS. 5-13, may also be formed in the second RDL structure 520. To form the over-via opening 526 shown in FIG. 19, a patterned photoresist is formed over a polymer layer 521. The patterned photoresist includes a feature at a location where the over-via opening 526 will be. This feature prevents formation of the RDL layer at that location, thereby forming the over-via opening 526. Similar techniques may be used to form other types of stress release openings at different locations in the RDL layer. In FIG. 19, the IC die 510, which includes a silicon substrate, plays a role similar to the substrate 102 in FIG. 1 to direct stress upward.

Figure 20:
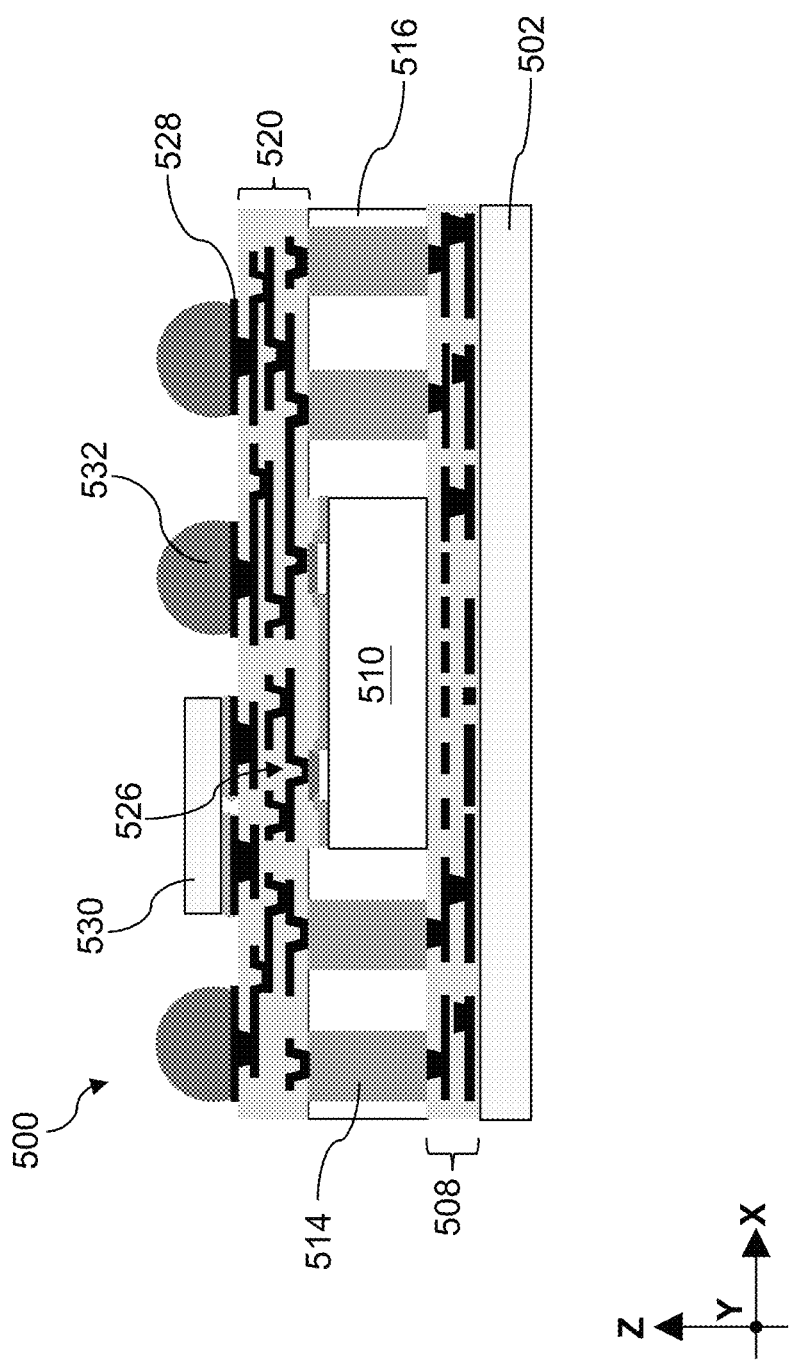

Referring to FIGS. 14 and 20, method 400 includes a block 414 where under bump metallization (UBM) features 528 are formed over the second RDL structure 520. At block 414, the UBM features 528 and a surface mount device (SMD) 530 are formed over the second RDL structure 520. The UBM features 528 are configured to receive solder bumps to ball grid array (BGA) balls, controlled collapse chip connector (C4) bumps, and the like. The UBM features 528 and the SMD 530 are electrically coupled to the IC die 510 by way of the second RDL structure 520. Examples of the surface mount device 530 include integrated passive devices, such as resistors, capacitors, inductors, or resistor-capacitor.

Referring to FIGS. 14 and 20, method 400 includes a block 416 where solder bumps 532 are formed over the UBM features 528. In an example process, solder is deposited over the UBM features 528. A reflow process is then performed to form the solder bumps 532. The solder bumps 532 may be used to electrically couple the device package 500 to other package components such as another device die, interposers, package substrates, printed circuit boards (PCBs), or the like.

Figure 21:
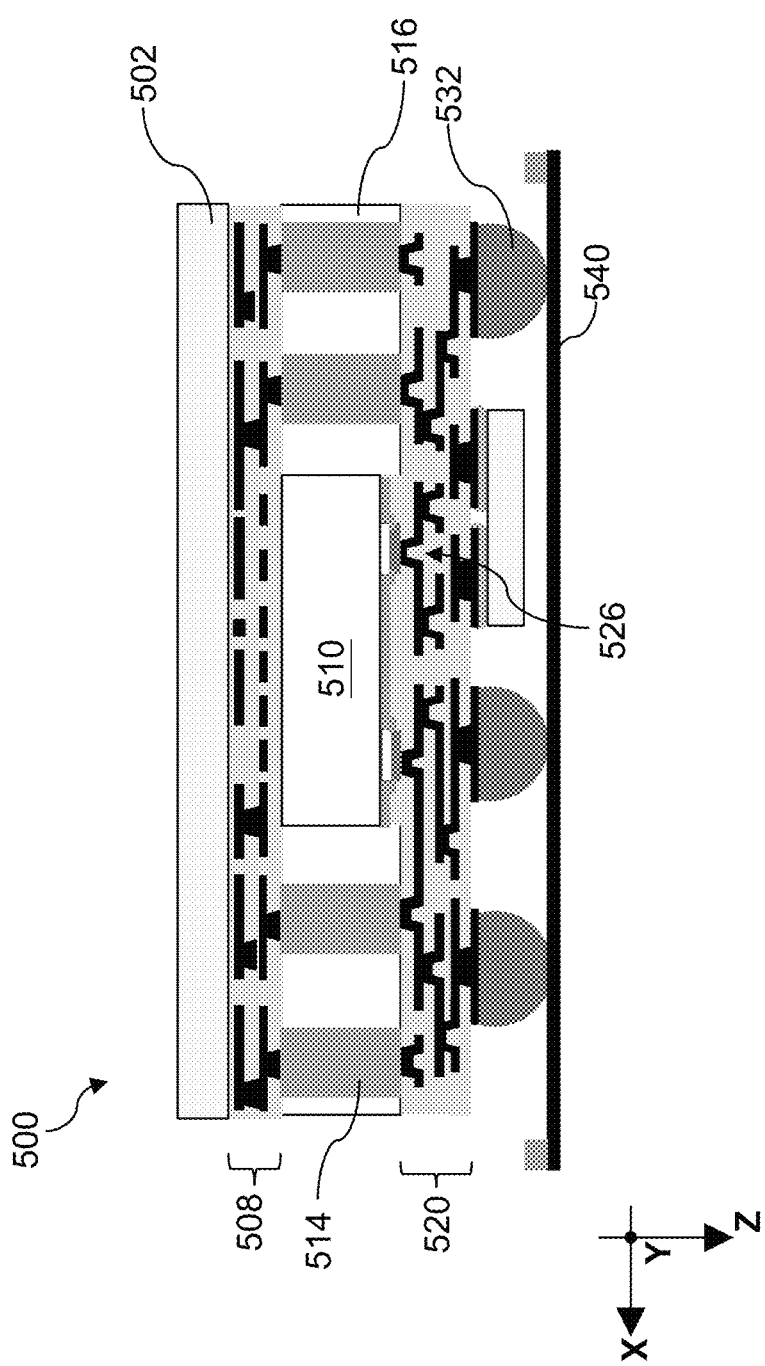

Referring to FIGS. 14 and 21, method 400 includes a block 418 where the solder bumps 532 are mounted on a carrier tape 540. In some embodiments, the carrier tape 540 has an adhesive surface that is used to attach to the solder bumps 532 of the device package 500. In an example process, the device package 500 is flipped over such that the carrier substrate 502 is pointed upward. The solder bumps 532 are then allowed to physically contact the carrier tape 540. The adhesive surface is activated to bond to the solder bumps 532.

Figure 22:
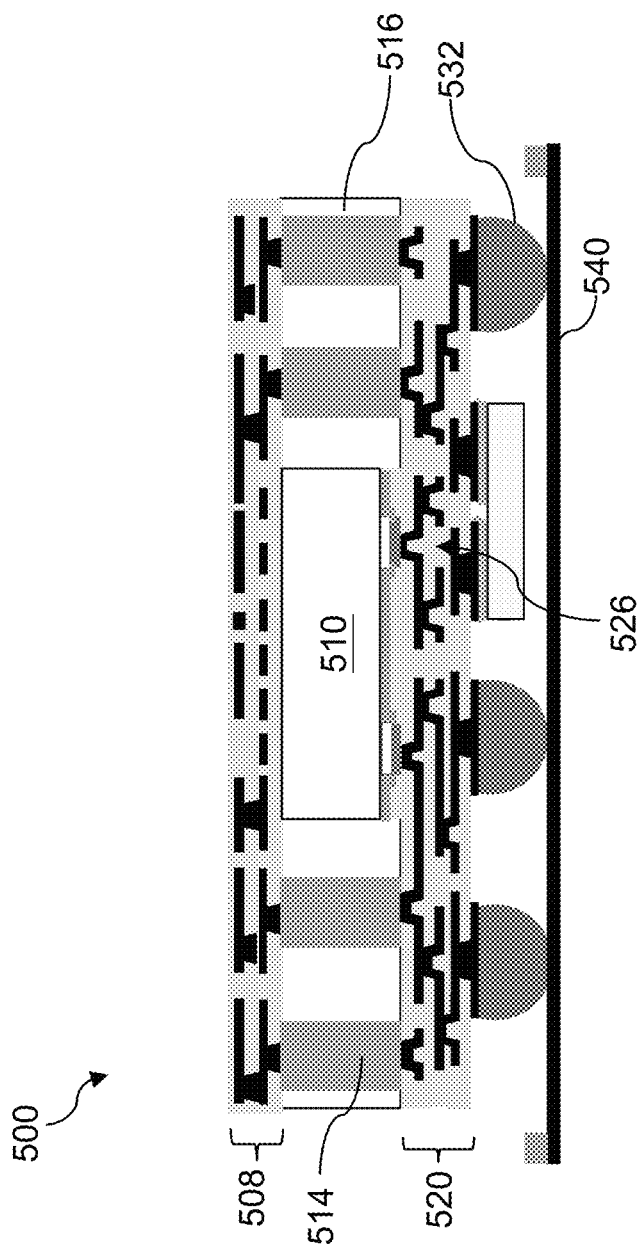

Referring to FIGS. 14 and 22, method 400 includes a block 420 where the carrier substrate 502 is removed. After the device package 500 is mounted on the carrier tape 540, the carrier substrate 502 is de-bonded or removed from the device package 500. In embodiments where the carrier substrate 502 interfaces the first RDL structure 508 with an adhesive layer, the carrier substrate 502 may be de-bonded by, for example, exposing the adhesive layer to ultraviolet (UV) radiation, laser, or heat to cause the adhesive layer to lose its adhesive property.

Figure 23:
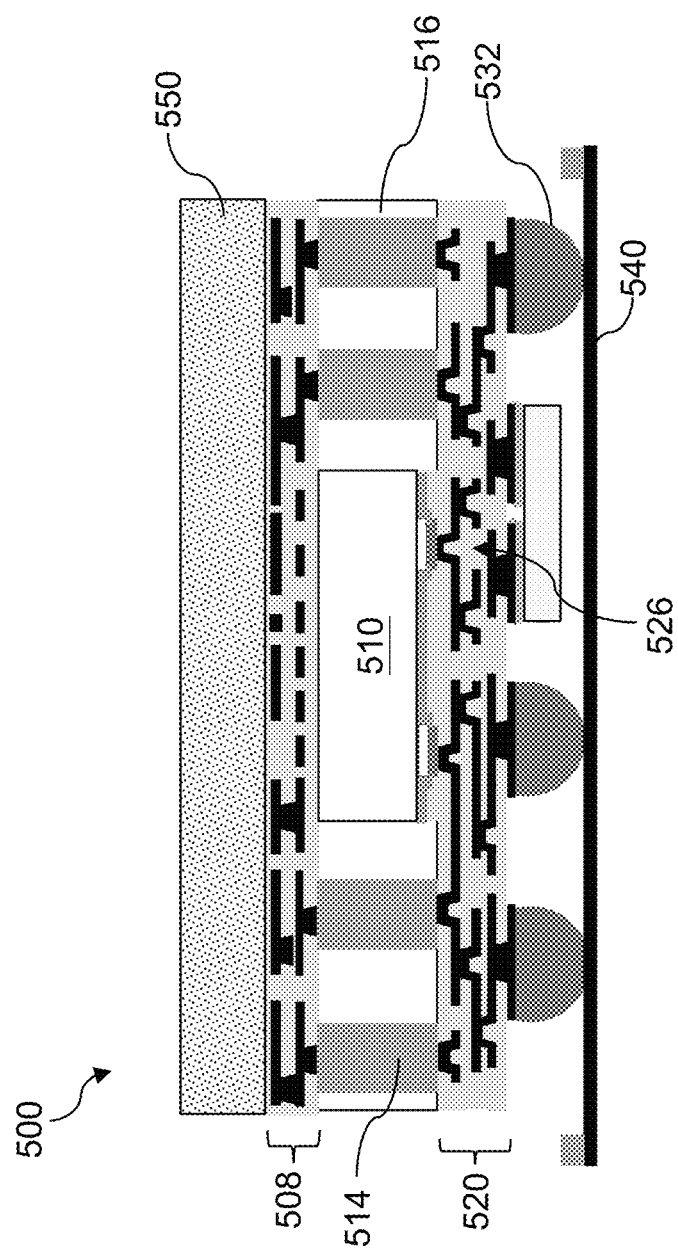

Referring to FIGS. 14 and 23, method 400 includes a block 422 where a lamination layer 550 is formed over the first RDL structure 508. In some embodiments, the lamination layer 550 may include a material similar to that of the molding layer 516. In these embodiments, the lamination layer 550 may include polyimide (PI), polybenzoxazole (PBO), benzocyclobuten (BCB), epoxy, silicone, acrylates, nano-filled pheno resin, siloxane, fluorinated polymer, or polynorbornene. In some other embodiments, both the molding layer and the lamination layer 550 include fillers, such as carbon or glass. Because the lamination layer 550 is formed over the backside of the IC die 510, the lamination layer 550 may also be referred to as a backside enhancement layer (BEL) 550.

Figure 24:
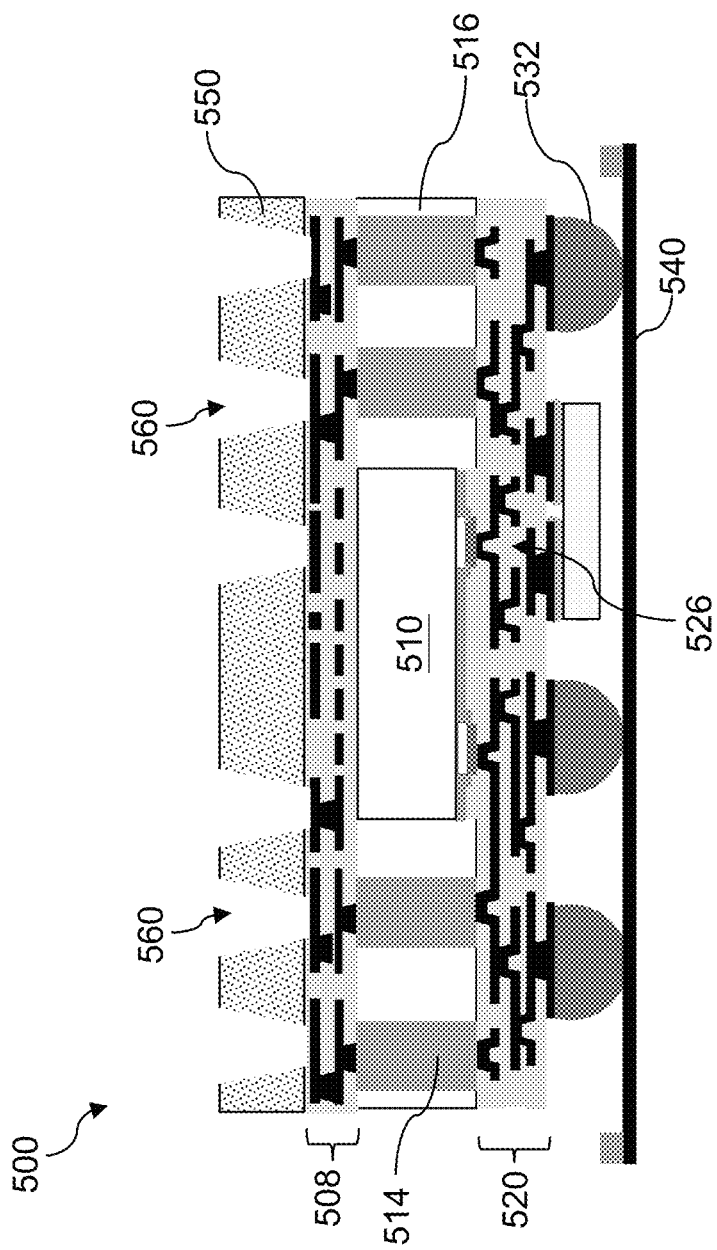

Referring to FIGS. 14 and 24, method 400 includes a block 424 where openings 560 are formed in the lamination layer 550. A laser drilling process may be performed to form the openings 560 through the lamination layer 550. As shown in FIG. 24, the openings 560 extend not only completely through the lamination layer 550 but also through a bottommost polymer layer 504 (with the device package 500 flipped upside down, the topmost polymer layer 504) to expose the bottommost RDL layer 506 (with the device package 500 flipped upside down, the topmost RDL layer 506) in the first RDL structure 508.

Figure 25:
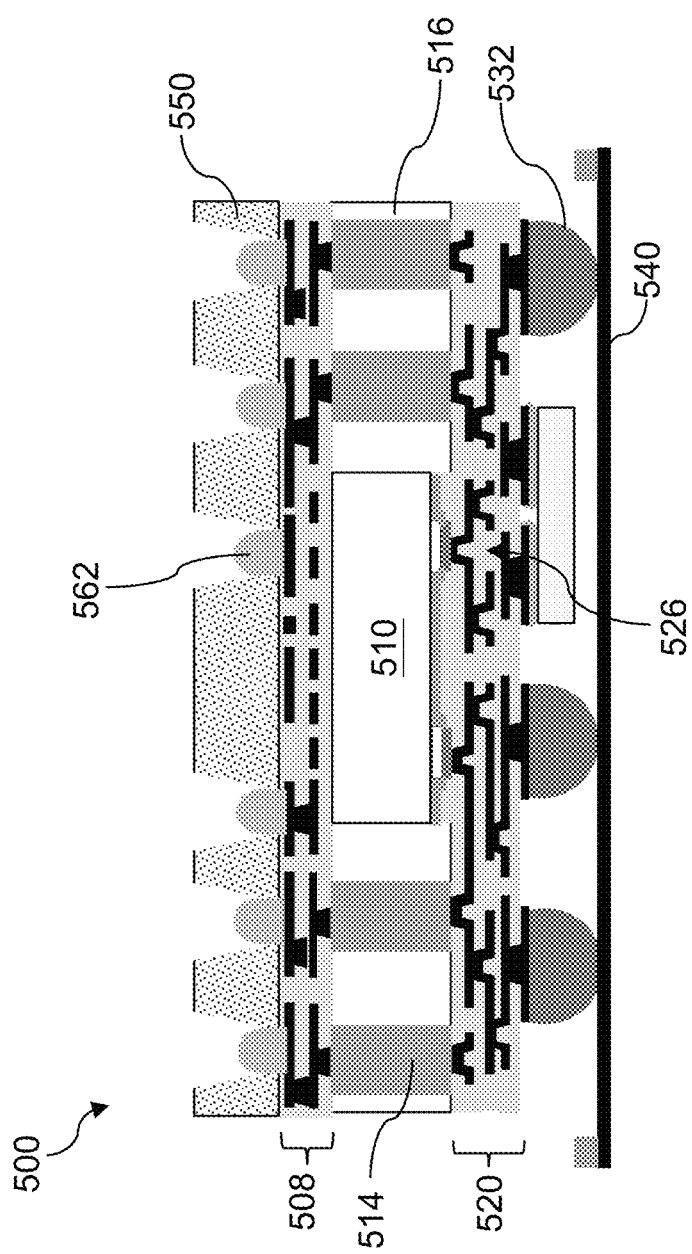

Referring to FIGS. 14 and 25, method 400 includes a block 426 where further processes are performed. Such further processes may include forming pre-solder features 562 in the openings 560 in the lamination layer and sawing of the device package 500 off of a bulk workpiece.

One aspect of the present disclosure involves a redistribution structure. The redistribution structure includes a first polymer layer disposed over a silicon substrate, a first contact via disposed in the first polymer layer, a second polymer layer disposed over the first contact via, a first redistribution layer having a first conductive pad disposed on the second polymer layer and a second contact via extending through the second polymer layer to physical contact the first contact via, a third polymer layer disposed over the first redistribution layer, and a second redistribution layer including a second conductive pad disposed on the third polymer layer and a plurality of third contact vias extending through the third polymer layer to physically contact the first conductive pad. The plurality of third contact vias are adjacent a vertical projection area of the second contact via. The first conductive pad includes at least one opening and the second conductive pad includes at least one opening.

In some embodiments, the first polymer layer, the second polymer layer and the third polymer layer include polyimide (PI), polybenzoxazole (PBO), benzocyclobuten (BCB), epoxy, silicone, acrylates, nano-filled pheno resin, siloxane, fluorinated polymer, or polynorbornene. In some implementations, the first contact via, the first redistribution layer and the second redistribution layer including copper (Cu). In some implementations, the plurality of third contact vias include four (4) third contact vias, the four (4) third contact vias form a quadrilateral from a top view, and a geographic center of the quadrilateral overlaps with the vertical projection area of the second contact via. In some embodiments, the quadrilateral includes a square or an isosceles trapezoid. In some instances, the at least one opening in the first redistribution layer includes a first opening disposed between the first conductive pad and the second contact via. In some implementations, the at least one opening in the second redistribution layer includes a second opening disposed in the second conductive pad and directly over the second contact via. In some implementations, the second contact via is substantially circular and includes a diameter and the second opening is substantially circular and includes the diameter.

Another aspect of the present disclosure involves a conductive structure. The conductive structure includes a first contact via, a first polymer layer disposed over the first contact via, a first redistribution layer including a first conductive pad disposed on the first polymer layer and a second contact via extending through the first polymer layer to physical contact the first contact via, a second polymer layer disposed over the first redistribution layer, and a second redistribution layer recessing a second conductive pad disposed on the second polymer layer and a plurality of third contact vias extending through the second polymer layer to physically contact the first conductive pad. The plurality of third contact vias surround a vertical projection area of the second contact via and the second conductive pad includes a first opening directly over the second contact via.

In some embodiments, the first polymer layer and the second polymer layer include polyimide (PI), polybenzoxazole (PBO), benzocyclobuten (BCB), epoxy, silicone, acrylates, nano-filled pheno resin, siloxane, fluorinated polymer, or polynorbornene. In some embodiments, the first contact via, the first redistribution layer and the second redistribution layer include copper (Cu). In some implementations, the plurality of third contact vias form a quadrilateral from a top view and a geographic center of the quadrilateral overlaps with the vertical projection area of the second contact via. In some embodiments, the quadrilateral includes a square or an isosceles trapezoid. In some implementations, the second contact via is substantially circular and includes a diameter and the first opening is substantially circular and includes the diameter. In some instances, the first contact via is disposed over a semiconductor substrate.

Still another aspect of the present disclosure involves a method. The method includes forming a first redistribution layer (RDL) structure over a carrier substrate, forming a plurality of through vias over the first RDL structure, bonding an IC die to the first RDL structure, forming a molding layer over the first RDL structure, the plurality of through vias and the IC die, planarizing the molding layer to expose the plurality of through vias, and forming a second RDL structure over the planarized molding layer. The forming of the second RDL structure includes forming a first contact via over the IC die, depositing first polymer layer over the first contact via, forming a first redistribution layer including a first conductive pad disposed on the first polymer layer and a second contact via extending through the first polymer layer to physical contact the first contact via, depositing a second polymer layer over the first redistribution layer, forming a second redistribution layer having a second conductive pad disposed on the second polymer layer and a plurality of third contact vias extending through the second polymer layer to physically contact the first conductive pad. The plurality of third contact vias surround a vertical projection area of the second contact via and the second conductive pad includes a first opening directly over the second contact via.

In some embodiments, the method further includes forming under-bump metallization (UBM) features over the second RDL structure, forming solder features on a first subgroup of the UBM features, bonding a second die on a second subgroup of the UBM features, and after the bonding, mounting the solder features on a tape carrier. In some implementations, the method further includes depositing a lamination layer over the first RDL structure, forming openings through the lamination layer using laser drilling, and depositing pre-solder features in the openings. In some embodiments, the plurality of third contact vias form a quadrilateral from a top view and a geographic center of the quadrilateral overlaps with the vertical projection area of the second contact via. In some embodiments, the first polymer layer and the second polymer layer include polyimide (PI), polybenzoxazole (PBO), benzocyclobuten (BCB), epoxy, silicone, acrylates, nano-filled pheno resin, siloxane, fluorinated polymer, or polynorbornene.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A redistribution structure, comprising:
    a first polymer layer disposed over a silicon substrate;
    a first contact via disposed in the first polymer layer;
    a second polymer layer disposed over the first contact via;
    a first redistribution layer comprising a first conductive pad disposed on the second polymer layer and a second contact via extending through the second polymer layer to physical contact the first contact via;
    a third polymer layer disposed over the first redistribution layer; and
    a second redistribution layer comprising a second conductive pad disposed on the third polymer layer and a plurality of third contact vias extending through the third polymer layer to physically contact the first conductive pad,
    wherein the plurality of third contact vias are adjacent a vertical projection area of the second contact via,
    wherein the second contact via comprises at least one via-edge opening along a rim of the second contact via,
    wherein the second conductive pad comprises at least one over-via opening directly over the second contact via.

2. The redistribution structure of claim 1, wherein the first polymer layer, the second polymer layer and the third polymer layer comprise polyimide (PI), polybenzoxazole (PBO), benzocyclobuten (BCB), epoxy, silicone, acrylates, nano-filled pheno resin, siloxane, fluorinated polymer, or polynorbornene.

3. The redistribution structure of claim 1, wherein the first contact via, the first redistribution layer and the second redistribution layer comprise copper (Cu).

4. The redistribution structure of claim 1,
    wherein the plurality of third contact vias comprise four (4) third contact vias,
    wherein the four (4) third contact vias form a quadrilateral from a top view,
    wherein a geographic center of the quadrilateral overlaps with the vertical projection area of the second contact via.

5. The redistribution structure of claim 4, wherein the quadrilateral comprises a square or an isosceles trapezoid.

6. The redistribution structure of claim 1,
    wherein the at least one via-edge opening comprises a first opening that falls within a vertical overlapping area of the first contact via and one of the plurality of third contact vias.

7. The redistribution structure of claim 1,
    wherein the at least one over-via opening comprises a second opening,
    wherein the second opening is substantially circular.

8. The redistribution structure of claim 7,
    wherein the second contact via is substantially circular and comprises a diameter,
    wherein the second opening comprises the diameter.

9. A conductive structure, comprising:
    a first contact via;
    a first polymer layer disposed over the first contact via;
    a first redistribution layer comprising a first conductive pad disposed on the first polymer layer and a second contact via extending through the first polymer layer to physical contact the first contact via;

a second polymer layer disposed over the first redistribution layer; and a second redistribution layer comprising a second conductive pad disposed on the second polymer layer and a plurality of third contact vias extending through the second polymer layer to physically contact the first conductive pad, wherein the plurality of third contact vias surround a vertical projection area of the second contact via, wherein the second conductive pad comprises a first opening directly over the second contact via, wherein the plurality of third contact vias form a quadrilateral from a top view.

10. The conductive structure of claim 9, wherein the first polymer layer and the second polymer layer comprise polyimide (PI), polybenzoxazole (PBO), benzocyclobuten (BCB), epoxy, silicone, acrylates, nano-filled pheno resin, siloxane, fluorinated polymer, or polynorbornene.

11. The conductive structure of claim 9, wherein the first contact via, the first redistribution layer and the second redistribution layer comprise copper (Cu).

12. The conductive structure of claim 9,
wherein a geographic center of the quadrilateral overlaps with the vertical projection area of the second contact via.

13. The conductive structure of claim 9, wherein the quadrilateral comprises a square or an isosceles trapezoid.

14. The conductive structure of claim 9,
wherein the second contact via is substantially circular and comprises a diameter,
wherein the first opening is substantially circular and comprises the diameter.

15. The conductive structure of claim 9, wherein the first contact via is disposed over a semiconductor substrate.

16. A method, comprising:
forming a first redistribution layer (RDL) structure over a carrier substrate;
forming a plurality of through vias over the first RDL structure;
bonding an IC die to the first RDL structure;
forming a molding layer over the first RDL structure, the plurality of through vias and the IC die;
planarizing the molding layer to expose the plurality of through vias; and
forming a second RDL structure over the planarized molding layer,
wherein the forming of the second RDL structure comprises:
forming a first contact via over the IC die,
depositing first polymer layer over the first contact via,
forming a first redistribution layer comprising a first conductive pad disposed on the first polymer layer and a second contact via extending through the first polymer layer to physical contact the first contact via,
depositing a second polymer layer over the first redistribution layer, and
forming a second redistribution layer comprising a second conductive pad disposed on the second polymer layer and a plurality of third contact vias extending through the second polymer layer to physically contact the first conductive pad, wherein the plurality of third contact vias surround a vertical projection area of the second contact via, wherein the second conductive pad comprises a first opening directly over the second contact via, wherein the plurality of third contact vias form a quadrilateral from a top view, wherein a geographic center of the quadrilateral overlaps with the vertical projection area of the second contact via.

17. The method of claim 16, further comprising:
forming under-bump metallization (UBM) features over the second RDL structure;
forming solder features on a first subgroup of the UBM features;
bonding a second die on a second subgroup of the UBM features; and
after the bonding, mounting the solder features on a tape carrier.

18. The method of claim 17, further comprising:
depositing a lamination layer over the first RDL structure;
forming openings through the lamination layer using laser drilling; and
depositing a pre-solder features in the openings.

19. The method of claim 16, wherein the first polymer layer and the second polymer layer comprise polyimide (PI), polybenzoxazole (PBO), benzocyclobuten (BCB), epoxy, silicone, acrylates, nano-filled pheno resin, siloxane, fluorinated polymer, or polynorbornene.

20. The method of claim 16, wherein the second contact via comprises a plurality of second openings around a rim of the second contact via.

* * * * *